(12) United States Patent
Cui et al.

(10) Patent No.: US 12,531,332 B2
(45) Date of Patent: Jan. 20, 2026

(54) ENCLOSURE STRUCTURE, ELECTRONIC DEVICE, AND ENCLOSURE STRUCTURE PREPARATION METHOD

(71) Applicant: Huawei Technologies Co., Ltd., Guangdong (CN)

(72) Inventors: Yongtao Cui, Dongguan (CN); Yuchan Yang, Shanghai (CN); Rong Ma, Shenzhen (CN); Heshuai Si, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 501 days.

(21) Appl. No.: 17/990,447

(22) Filed: Nov. 18, 2022

(65) Prior Publication Data

US 2023/0118584 A1 Apr. 20, 2023

Related U.S. Application Data

(63) Continuation of application No. PCT/CN2021/091784, filed on Apr. 30, 2021.

(30) Foreign Application Priority Data

May 21, 2020 (CN) .......................... 202010438304.1
Jul. 17, 2020 (CN) .......................... 202010693924.X

(51) Int. Cl.
*H01Q 1/40* (2006.01)
*H01Q 1/00* (2006.01)
(Continued)

(52) U.S. Cl.
CPC ............. *H01Q 1/405* (2013.01); *H01Q 1/002* (2013.01); *H01Q 1/244* (2013.01); *H05K 5/0247* (2013.01)

(58) Field of Classification Search
CPC .. H05K 5/0247; H05K 5/0217; H05K 5/0243; H01Q 1/002; H01Q 1/244; H01Q 1/243; H01Q 1/38; H01Q 1/405
See application file for complete search history.

(56) References Cited

U.S. PATENT DOCUMENTS

| | | | |
|---|---|---|---|
| 11,495,881 B1 * | 11/2022 | Harvey | H01Q 1/02 |
| 2010/0283024 A1 * | 11/2010 | Yoshizumi | G11C 13/00 |
| | | | 977/773 |
| 2015/0188210 A1 | 7/2015 | Asrani et al. | |

FOREIGN PATENT DOCUMENTS

| | | |
|---|---|---|
| CN | 101431175 A | 5/2009 |
| CN | 102404958 A | 4/2012 |

(Continued)

*Primary Examiner* — Dhaval V Patel
(74) *Attorney, Agent, or Firm* — WOMBLE BOND DICKINSON (US) LLP

(57) ABSTRACT

Embodiments of this application provide an enclosure structure, an electronic device, and an enclosure structure preparation method; and relate to the field of electronic device technologies. The enclosure structure includes an enclosure and an antenna grain line. At least a part of the enclosure is made of a non-metal material to form a non-metal part, the non-metal part has a first surface and a second surface that are opposite to each other, the first surface faces an exterior of the electronic device, and the second surface faces an interior of the electronic device. The antenna grain line is disposed on the first surface; or a groove is disposed on the second surface, and the antenna grain line is disposed in the groove.

21 Claims, 14 Drawing Sheets

(51) Int. Cl.
    *H01Q 1/24*         (2006.01)
    *H05K 5/02*         (2006.01)

(56)         References Cited

FOREIGN PATENT DOCUMENTS

| | | | | |
|---|---|---|---|---|
| CN | 103179815 A | 6/2013 | | |
| CN | 104051844 A | 9/2014 | | |
| CN | 105742797 A | 7/2016 | | |
| CN | 107866943 A | 4/2018 | | |
| CN | 108539386 A | 9/2018 | | |
| CN | 110021821 A * | 7/2019 | ............... | H01Q 1/22 |
| EP | 2246185 A1 * | 11/2010 | ............... | B32B 1/02 |
| KR | 20120120790 * | 11/2012 | ............... | B32B 1/02 |
| KR | 20120120790 A | 11/2012 | | |
| WO | WO-2018157707 A1 * | 9/2018 | ............... | H01Q 1/22 |

\* cited by examiner

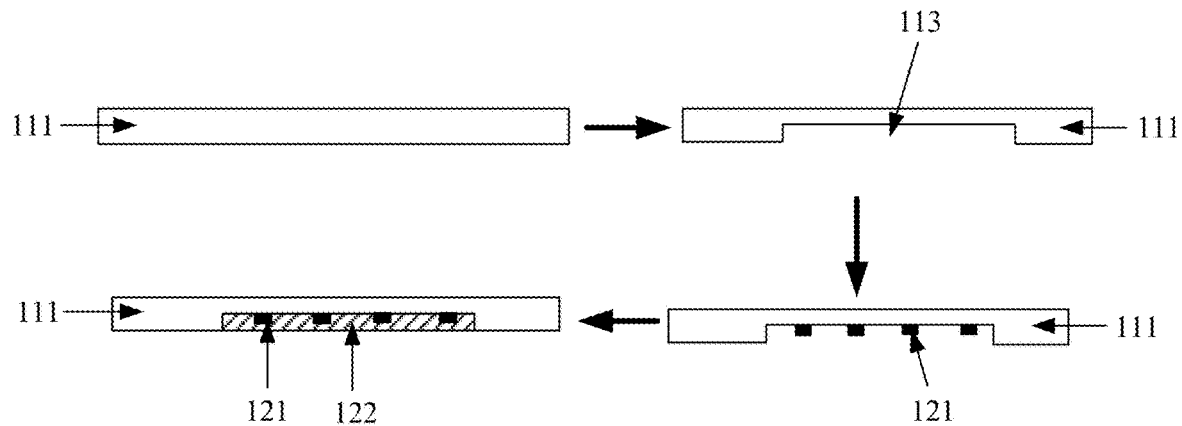

FIG. 23

```
Form a fifth area on a second surface of a non-metal part of an enclosure, where a
sixth area is an area other than the fifth area on the second surface, an antenna grain    S301
line is formed in the fifth area, an auxiliary grain line is formed in the sixth area, the
antenna grain line in the fifth area is connected, and the auxiliary grain line in the
sixth area is disconnected; and the non-metal part is made of a non-metal material,
the non-metal part has a first surface and a second surface that are opposite to each
other, the first surface faces an exterior of the electronic device, and the second
surface faces an interior the inside of the electronic device
                                    ↓
           Dispose a protective layer, where the protective       S302
           layer covers exteriors of the antenna grain line and
                        the auxiliary grain line
```

FIG. 24

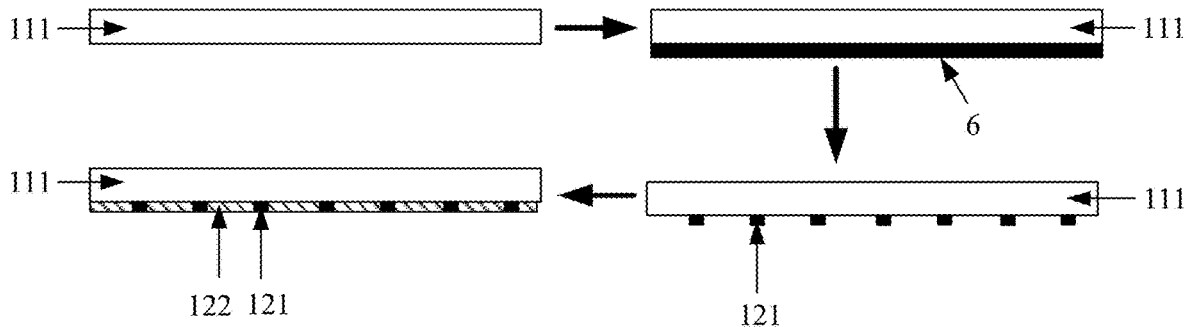

FIG. 25

ENCLOSURE STRUCTURE, ELECTRONIC DEVICE, AND ENCLOSURE STRUCTURE PREPARATION METHOD

CROSS-REFERENCE TO RELATED APPLICATIONS

This application is a continuation of International Application No. PCT/CN2021/091784, filed on Apr. 30, 2021, which claims priority to Chinese Patent Application No. 202010438304.1, filed on May 21, 2020 and Chinese Patent Application No. 202010693924.X, filed on Jul. 17, 2020. All of the aforementioned patent applications are hereby incorporated by reference in their entireties.

TECHNICAL FIELD

This application relates to the field of electronic device technologies, and in particular, to an enclosure structure, an electronic device, and an enclosure structure preparation method.

BACKGROUND

With continuous development of an electronic device, the electronic device has more intelligent functions, and a communication range that needs to be covered by the electronic device is wider. Further, more antennas are used in the electronic device, and space occupied by the antennas in the electronic device is also increasing. However, with development of miniaturization of the electronic device, installation space reserved for the antennas is also limited. Therefore, how to install more antennas in the limited space is a technical problem to be urgently resolved in the antenna structure field.

FIG. 1 shows an existing antenna layout solution in a mobile phone. An antenna 02 is deployed on an inner surface of a backplane 01 of the mobile phone. In other words, a size of the inner surface of the backplane of the mobile phone is used to deploy the antenna. However, the antenna still occupies internal space of the mobile phone. In addition, thickness of the backplane of the mobile phone also decreases a clearance height of the antenna. Consequently, a gain of the antenna is decreased, and antenna efficiency is affected.

SUMMARY

Embodiments of this application provide an enclosure structure, an electronic device, and an enclosure structure preparation method, to provide an electronic device in which internal space of the electronic device is not occupied and antenna efficiency is improved.

To achieve the foregoing objectives, the following technical solutions are used in embodiments of this application.

According to a first aspect, this application provides an enclosure structure. The enclosure structure includes:
 an enclosure, including a non-metal part, where the non-metal part is made of a non-metal material, the non-metal part has a first surface and a second surface that are opposite to each other, the first surface faces an exterior of an electronic device, and the second surface faces an interior of the electronic device; and
 an antenna grain line, where the antenna grain line is disposed on the first surface.

In the enclosure structure that can be used as the enclosure of the electronic device and that is provided in this embodiment of this application, because the antenna grain line is disposed on the non-metal part of the enclosure and is located on the first surface that is of the non-metal part and that faces the exterior of the electronic device, so that internal space of the electronic device is not occupied. This effect is more obvious especially for an electronic device with a large quantity of antennas. In addition, a clearance height of an antenna is further increased, a gain of the antenna is increased, antenna efficiency is improved, and appearance aesthetics of the antenna grain line based on a grain feature can also be ensured.

In one embodiment, the enclosure structure further includes a protective layer. The protective layer covers an exterior of the antenna grain line. When the enclosure structure of the electronic device is used as the enclosure of the electronic device, the antenna is exposed outside the electronic device. Because the antenna grain line is disposed on the first surface and located inside the protective layer, the protective layer protects the antenna grain line. In this way, the antenna grain line is prevented from being worn out, and a service life of the antenna grain line is prolonged.

In one embodiment, the antenna grain line includes, in a direction away from the enclosure, a transition layer, a conductive layer, and a corrosion-resistant layer that are disposed in a stacked manner. Because the conductive layer is made of metals and metal-oxide materials, bonding force between the conductive layer and the non-metal part can be increased by disposing the transition layer, to enhance connection strength between the conductive layer and the non-metal part. The corrosion-resistant layer is further disposed to protect the conductive layer, and a service life of the conductive layer is prolonged.

In one embodiment, the antenna grain line has a third surface and a fourth surface that are opposite to each other, the fourth surface is in contact with the first surface, and a vertical projection of the third surface on the fourth surface covers a part of the fourth surface. The part of the fourth surface is covered by the vertical projection of the third surface on the fourth surface, in other words, an area of the third surface is smaller than an area of the fourth surface. In this way, a formed cross section of the antenna grain line is of a trapezoidal structure, to improve scratch resistance performance of the antenna grain line, and prolong the service life of the antenna grain line.

In one embodiment, a first area is formed on the first surface, a second area is an area other than the first area on the first surface, the antenna grain line is located in the first area, an auxiliary grain line is formed in the second area, the antenna grain line in the first area is connected, and the auxiliary grain line in the second area is disconnected. In other words, not only the antenna grain line is disposed in the first area on the first surface, but also the auxiliary grain line is disposed in the second area other than the first area on the first surface. That is, the lines are disposed on the entire first surface. Compared with a phenomenon that a line is disposed in some areas and no line is disposed in some areas, uniformity of light transmittance of the entire non-metal part can be improved, and a phenomenon that a local area has a color different from those of other areas can be avoided. In addition, the antenna grain line in the first area is connected, to receive and send a signal; and the auxiliary grain line in the second area is disconnected, and no signal is received or sent.

In one embodiment, a line width of the antenna grain line ranges from 0.5 μm to 1000 μm, and a spacing between two adjacent branches of the antenna grain line ranges from 5 μm to 1000 μm. The line width of the antenna grain line ranges from 0.5 µm to 1000 µm, and the spacing between the two adjacent branches of the antenna grain line ranges from 5 µm to 1000 µm, so that human eyes cannot see the antenna grain line, appearance aesthetics is improved, and uniformity of light transmittance is ensured.

In one embodiment, a conductive through hole is disposed on the non-metal part. The conductive through hole passes through the first surface and the second surface. One end that is of the conductive through hole and that is located on the first surface is electrically connected to the antenna grain line located on the first surface, one end that is of the conductive through hole and that is located on the second surface is configured to electrically connect to a first signal line disposed in the electronic device, and the first signal line is electrically connected to an antenna transceiver module. Because the antenna grain line is disposed on the first surface, in other words, faces the exterior of the electronic device, and the antenna transceiver module is disposed inside the electronic device, the antenna grain line needs to be electrically connected to the antenna transceiver module. The conductive through hole is disposed on the non-metal part to electrically connect the antenna grain line to the antenna transceiver module. A structure is simple, and easy to implement.

In one embodiment, a second signal line is disposed on the second surface. The second signal line extends to an edge of the second surface and is electrically connected to the antenna grain line located on the first surface. The first signal line is configured to electrically connect to a first signal line disposed in the electronic device, and the first signal line is electrically connected to an antenna transceiver module. Because the antenna grain line is disposed on the first surface, in other words, faces the exterior of the electronic device, and the antenna transceiver module is disposed inside the electronic device, the antenna grain line needs to be electrically connected to the antenna transceiver module. The second signal line is disposed on the second surface, and the second signal line extends to the edge of the second surface to electrically connect to the antenna grain line on the first surface. A structure is also simple, and easy to implement.

In one embodiment, the non-metal part is made of glass, plastic, or ceramic.

According to a second aspect, this application provides an enclosure structure. The enclosure structure includes:
  an enclosure, including a non-metal part, where the non-metal part is made of a non-metal material, the non-metal part has a first surface and a second surface that are opposite to each other, the first surface faces an exterior of an electronic device, the second surface faces an interior of the electronic device, and a groove is disposed on the second surface; and
  an antenna grain line, where the antenna grain line is disposed in the groove.

In the enclosure structure that can be used as the enclosure of the electronic device and that is provided in this embodiment of this application, because the antenna grain line is disposed on the non-metal part of the enclosure, the groove is disposed on the second surface that is of the non-metal part and that faces the interior of the electronic device, and the antenna grain line is disposed in the groove, so that internal space of the electronic device is not occupied. This effect is more obvious especially for an electronic device with a large quantity of antennas. In addition, a clearance height of an antenna is increased, a gain of the antenna is increased, and antenna efficiency is improved. The antenna grain line based on a grain feature is used to avoid seeing the antenna from the outside.

In one embodiment, the enclosure structure further includes a protective layer. The protective layer covers an exterior of the antenna grain line. Because the antenna grain line is disposed on the second surface and located inside the protective layer, the protective layer protects the antenna grain line, to prevent the antenna grain line from being worn out by an internal structure of the electronic device, and prolong a service life of the antenna grain line.

In one embodiment, the antenna grain line includes, in a direction away from the enclosure, a transition layer, a conductive layer, and a corrosion-resistant layer that are disposed in a stacked manner. Because the conductive layer is made of metals and metal oxide materials, bonding force between the conductive layer and the non-metal part can be increased by disposing the transition layer, to enhance connection strength between the conductive layer and the non-metal part. The corrosion-resistant layer is further disposed to protect the conductive layer, and a service life of the conductive layer is prolonged.

In one embodiment, a groove depth of the groove ranges from 0.1 mm to 0.4 mm.

In one embodiment, the antenna grain line has a third surface and a fourth surface that are opposite to each other, the fourth surface is in contact with the second surface, and a vertical projection of the third surface on the fourth surface covers a part of the fourth surface. The part of the fourth surface is covered by the vertical projection of the third surface on the fourth surface, in other words, an area of the third surface is smaller than an area of the fourth surface. In this way, a formed cross section of the antenna grain line is of a trapezoidal structure, to improve scratch resistance performance of the antenna grain line, and prolong the service life of the antenna grain line.

In one embodiment, the non-metal part is made of glass, plastic, or ceramic.

In one embodiment, a line width of the antenna grain line ranges from 0.5 µm to 1000 µm, and a spacing between two adjacent branches of the antenna grain line ranges from 5 µm to 1000 µm. The line width of the antenna grain line ranges from 0.5 µm to 1000 µm, and the spacing between the two adjacent branches of the antenna grain line ranges from 5 µm to 1000 µm, so that when the non-metal part is of a transparent structure, human eyes cannot see the antenna grain line, and appearance aesthetics is improved.

In one embodiment, a bottom surface of the groove includes a third area and a fourth area, the fourth area is an area other than the third area on the bottom surface of the groove, the antenna grain line in the groove is located in the third area, an auxiliary grain line is disposed in the fourth area, the antenna grain line in the third area is connected, and the auxiliary grain line in the fourth area is disconnected. Generally, an area of the groove is basically the same as an area of the antenna grain line. However, in a specific implementation, due to a process error or another reason, the area of the groove may be generally larger than the area of the antenna grain line. In this case, the third area and the fourth area are formed on the bottom surface of the groove, the connected antenna grain line is disposed in the third area, and the disconnected auxiliary grain line is disposed in the fourth area. In this way, when the non-metal part is of the transparent structure, uniformity of light transmittance of the entire non-metal part can be improved, and a phenomenon that a local area has a color different from those of other areas can be avoided.

According to a third aspect, this application provides an enclosure structure. The enclosure structure includes:
- an enclosure, including a non-metal part, where the non-metal part is made of a non-metal material, the non-metal part has a first surface and a second surface that are opposite to each other, the first surface faces an exterior of an electronic device, the second surface faces an interior of the electronic device, and a groove is disposed on the second surface; and
- an antenna grain line, where the antenna grain line is disposed on the first surface and in the groove.

According to a fourth aspect, this application provides an enclosure structure. The enclosure structure includes:
- an enclosure, including a non-metal part, where the non-metal part is made of a non-metal material, the non-metal part has a first surface and a second surface that are opposite to each other, the first surface faces an exterior of an electronic device, the second surface faces an interior of the electronic device, a fifth area is formed on the second surface, and a sixth area is an area other than the fifth area on the second surface;
- an antenna grain line, where the antenna grain line is located in the fifth area and is connected; and
- an auxiliary grain line, where the auxiliary grain line is located in the sixth area and is disconnected.

In the enclosure structure that can be used as the enclosure of the electronic device and that is provided in this embodiment of this application, the antenna grain line is disposed in the fifth area on the second surface, and the auxiliary grain line is also disposed in the sixth area other than the fifth area on the second surface. The antenna grain line in the first area is connected, and is used to implement an antenna function; and the auxiliary grain line in the second area is disconnected, and does not receive an antenna signal. Because the grain lines are disposed on the entire second surface, when the non-metal part is of a transparent structure, the entire non-metal part has uniform light transmittance, and a phenomenon that a local area has a color different from those of other areas cannot be seen from the outside of the electronic device, so that aesthetics of the enclosure structure is ensured. Therefore, the enclosure structure provided in this application not only can implement the antenna function, but also comprehensively considers appearance aesthetics of the entire structure.

In one embodiment, the enclosure structure further includes a protective layer. The protective layer covers exteriors of the antenna grain line and the auxiliary grain line, and the protective layer is an ink layer or a lamination diaphragm. In this way, an existing shield layer may be used as the protective layer, so that no additional preparation process is added on a premise that the antenna grain line is protected.

According to a fifth aspect, this application provides an enclosure structure. The enclosure structure includes:
- an enclosure, including a non-metal part, where the non-metal part is made of a non-metal material, the non-metal part has a first surface and a second surface that are opposite to each other, the first surface faces an exterior of an electronic device, and the second surface faces an interior of the electronic device; and
- an antenna grain line, where the antenna grain line is disposed on the second surface and the first surface.

According to a sixth aspect, this application provides an electronic device. The electronic device includes:
- the enclosure structure in any implementation of the foregoing five aspects; and
- a circuit board, disposed inside an enclosure, where an antenna transceiver module and a first signal line connected to the antenna transceiver module are disposed on the circuit board, and the first signal line is electrically connected to an antenna grain line.

In one embodiment, the antenna grain line is connected to the first signal line through coupled feeding. The antenna grain line is connected to the first signal line through coupled feeding, which has a simple structure.

In one embodiment, a conductive through hole is disposed on a non-metal part, the conductive through hole passes through a first surface and a second surface, one end that is of the conductive through hole and that is located on the first surface is electrically connected to the antenna grain line, and one end that is of the conductive through hole and that is located on the second surface is electrically connected to the first signal line.

In one embodiment, a second signal line is disposed on the second surface, the second signal line extends to an edge of the second surface and is electrically connected to the antenna grain line located on the first surface, and the first signal line is electrically connected to the second signal line located on the second surface.

According to a seventh aspect, this application provides an enclosure structure preparation method. An enclosure structure includes an enclosure, the enclosure includes a non-metal part, the non-metal part is made of a non-metal material, the non-metal part has a first surface and a second surface that are opposite to each other, the first surface faces an exterior of an electronic device, and the second surface faces an interior of the electronic device. The preparation method includes:
- disposing an antenna grain line on the first surface.

In one embodiment, after the antenna grain line is disposed, the method further includes: disposing a protective layer, where the protective layer covers an exterior of the antenna grain line. The protective layer is disposed, to prevent the antenna grain line from being worn out.

In one embodiment, the disposing an antenna grain line includes: disposing, in a direction away from the enclosure, a transition layer, a conductive layer, and a corrosion-resistant layer in a stacked manner, to form the antenna grain line. Bonding force between the conductive layer and the non-metal part can be increased by depositing the transition layer, to enhance connection strength between the conductive layer and the non-metal part. The corrosion-resistant layer is disposed to protect the conductive layer, and a service life of the conductive layer is prolonged.

In one embodiment, the disposing an antenna grain line includes: covering an antenna film layer on the first surface; and forming the antenna grain line on the antenna film layer.

In one embodiment, the forming the antenna grain line on the antenna film layer includes: performing etching or laser engraving on the antenna film layer to form the antenna grain line.

In one embodiment, the disposing an antenna grain line includes: performing transfer printing, screen printing, spray coating, or exposure development on the first surface, to form the antenna grain line.

In one embodiment, the disposing an antenna grain line includes: dividing the first surface into a first area and a second area, where the second area is an area other than the first area on the first surface; preparing the antenna grain line in the first area, where the antenna grain line is connected; and preparing an auxiliary grain line in the second area, where the auxiliary grain line is disconnected. That is, the grain lines are disposed on the entire first surface, so that light transmittance of the first surface is uniform. In one embodiment of the seventh aspect, the disposing an antenna grain line includes: covering the antenna film layer on the first surface; forming the grain lines on the antenna film layer; and then disconnecting a part of the grain line in the second area, to form the disconnected auxiliary grain line in the second area. The grain line in the first area does not need to be disconnected, to form the connected antenna grain line in the first area.

According to an eighth aspect, this application provides an enclosure structure preparation method. The enclosure structure preparation method includes:

disposing a groove on a second surface; and
disposing an antenna grain line in the groove.

In one embodiment, after the antenna grain line is disposed, the method further includes: disposing a protective layer, where the protective layer covers an exterior of the antenna grain line. The protective layer is disposed to prevent the antenna grain line from being worn out, and a service life of the antenna grain line is prolonged.

In one embodiment, the disposing an antenna grain line includes: disposing, in a direction away from an enclosure, a transition layer, a conductive layer, and a corrosion-resistant layer in a stacked manner, to form the antenna grain line.

In one embodiment, the disposing an antenna grain line includes: covering an antenna film layer on a bottom surface of the groove; and forming the antenna grain line on the antenna film layer.

In one embodiment, the forming the antenna grain line on the antenna film layer includes: performing etching or laser engraving on the antenna film layer to form the antenna grain line.

In one embodiment, the disposing an antenna grain line includes: performing transfer printing, screen printing, spray coating, or exposure development on the bottom surface of the groove, to form the antenna grain line.

In one embodiment, the disposing an antenna grain line includes: dividing the bottom surface of the groove into a third area and a fourth area, where the fourth area is an area other than the third area on the bottom surface of the groove; preparing the antenna grain line in the third area, where the antenna grain line is connected; and preparing an auxiliary grain line in the fourth area, where the auxiliary grain line is disconnected.

In one embodiment, the disposing an antenna grain line includes: covering the antenna film layer on the bottom surface of the groove; forming the grain lines on the antenna film layer; and then disconnecting a part of the grain line in the fourth area, to form the disconnected auxiliary grain line in the fourth area. The grain line in the third area does not need to be disconnected, to form the connected antenna grain line in the third area.

According to a ninth aspect, this application provides an enclosure structure preparation method. An enclosure structure includes an enclosure, the enclosure includes a non-metal part, the non-metal part is made of a non-metal material, the non-metal part has a first surface and a second surface that are opposite to each other, the first surface faces an exterior of an electronic device, and the second surface faces an interior of the electronic device. The preparation method includes:

dividing the second surface into a fifth area and a sixth area, where the fifth area is an area other than the fifth area on the second surface;
preparing an antenna grain line in the fifth area, where the antenna grain line is connected; and
preparing an auxiliary grain line in the sixth area, where the auxiliary grain line is disconnected.

In one embodiment, the disposing an antenna grain line includes: covering an antenna film layer on the second surface; forming the grain lines on the antenna film layer; and then disconnecting a part of the grain line in the sixth area, to form the disconnected auxiliary grain line in the sixth area. The grain line in the fifth area does not need to be disconnected, to form the connected antenna grain line in the fifth area.

In one embodiment, the preparation method further includes: disposing the antenna grain line on the first surface.

In one embodiment, after the antenna grain line and the auxiliary grain line are disposed, the method further includes: disposing a protective layer, where the protective layer covers exteriors of the antenna grain line and the auxiliary grain line.

In one embodiment, disposing the antenna grain line and the auxiliary grain line includes: disposing, in a direction away from the enclosure, a transition layer, a conductive layer, and a corrosion-resistant layer in a stacked manner, to form the antenna grain line and the auxiliary grain line.

The enclosure structure prepared by using the enclosure structure preparation method provided in this embodiment of this application resolves a same technical problem as the enclosure structure in any embodiment of the foregoing five aspects, and achieves same expected technical effect.

BRIEF DESCRIPTION OF DRAWINGS

FIG. 23 is a corresponding cross-sectional view after operations in an enclosure structure preparation method are completed according to an embodiment of this application;

FIG. 24 is a flowchart block diagram of an enclosure structure preparation method according to an embodiment of this application;

FIG. 25 is a corresponding cross-sectional view after operations in an enclosure structure preparation method are completed according to an embodiment of this application;

REFERENCE NUMERALS

01—mobile phone backplane; 02—antenna; 1—enclosure structure; 11—enclosure; 111—non-metal part; 112—conductive through hole; 113—groove; 12—antenna; 121—antenna grain line; 1211—transition layer; 1212—conductive layer; 1213—corrosion-resistant layer; 122—protective layer; 13—auxiliary grain line; 2—circuit board; 3—first signal line; 4—support; 5—second signal line; 6—antenna film layer; A1—first surface; A2—second surface; B1—third surface; B2—fourth surface; P1—first area; and P2—second area.

DESCRIPTION OF EMBODIMENTS

Embodiments of this application relate to an electronic device, an enclosure structure, and an enclosure structure preparation method. The following describes in detail the electronic device, the enclosure structure, and the enclosure structure preparation method with reference to the accompanying drawings.

An embodiment of this application provides an electronic device. The electronic device includes an enclosure, an antenna, and a circuit board disposed inside the enclosure. An antenna transceiver module and a first signal line connected to the antenna transceiver module are disposed on the circuit board. The antenna is electrically connected to the first signal line.

It should be noted that the electronic device may be a mobile phone, a tablet computer, a wearable device (a watch, a wristband, or the like), a router, or the like.

Figure 1:
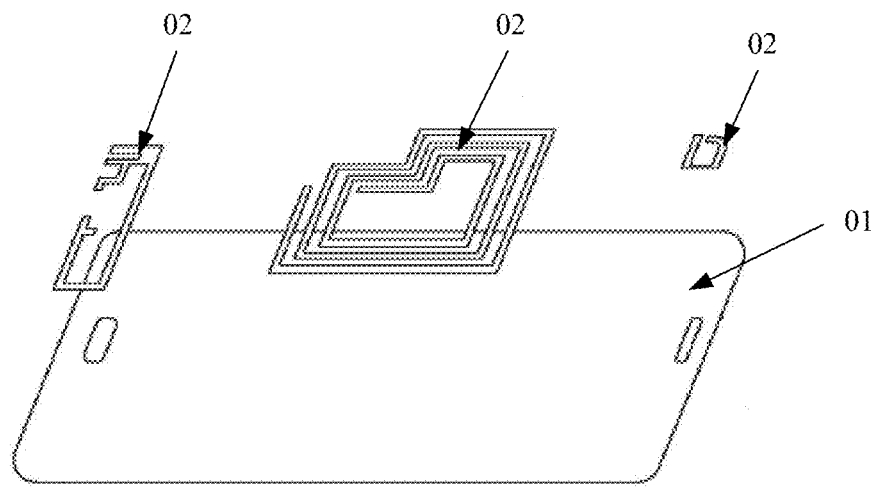
FIG. 1 is a schematic diagram of an antenna layout structure of a mobile phone in the conventional technology.
Figure 2:
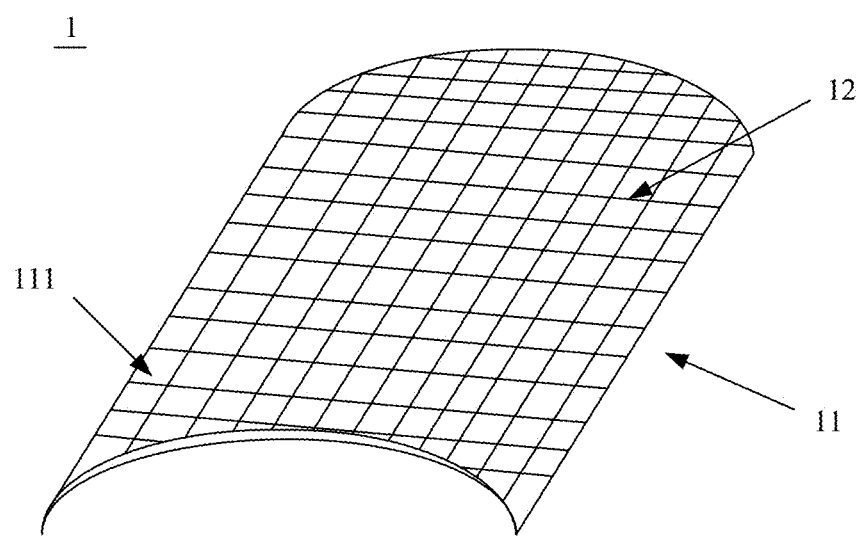
FIG. 2 is a schematic diagram of a structure of an enclosure structure according to an embodiment of this application.
Figure 3:
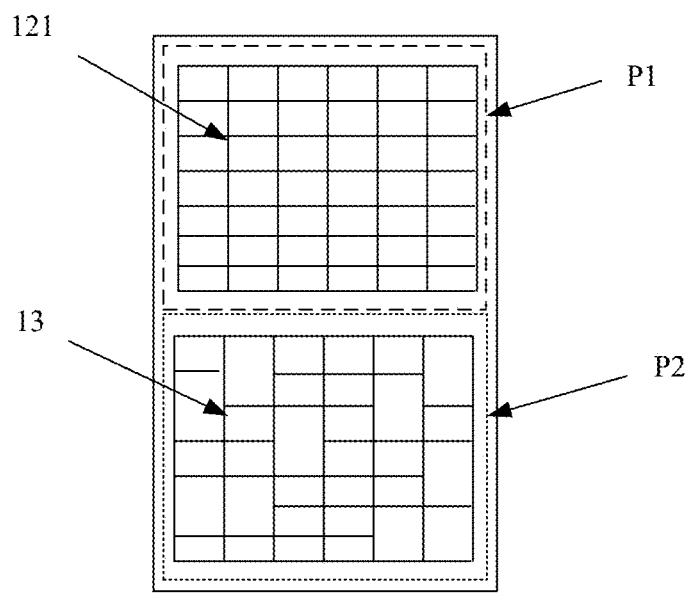
FIG. 3 is a schematic diagram of a structure of an enclosure structure according to an embodiment of this application.
Figure 4:
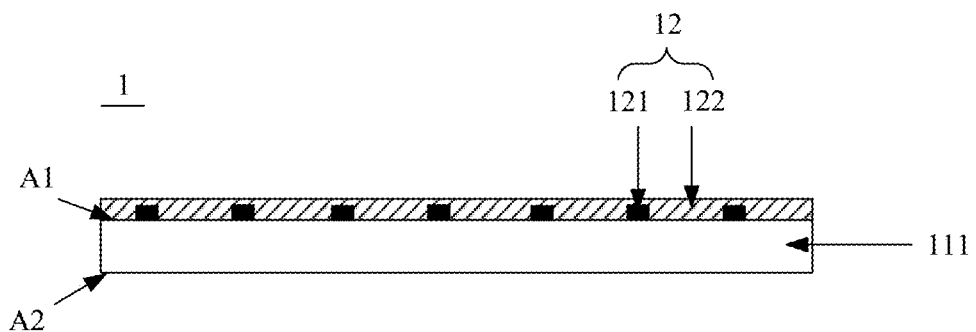
FIG. 4 is a cross-sectional view of an enclosure structure according to an embodiment of this application.

To prevent the antenna from occupying internal space of the electronic device, and to increase a clearance height of the antenna and improve antenna efficiency, an embodiment of this application provides an enclosure structure. The enclosure structure is used as the enclosure of the electronic device. Refer to FIG. 2 and FIG. 3. The enclosure structure 1 includes an enclosure 11 and an antenna 12, where the enclosure 11 includes a non-metal part 111, and the non-metal part 111 is made of a non-metal material (for example, glass, plastic, or ceramic). Refer to FIG. 4. The non-metal part 111 has a first surface A1 and a second surface A2 that are opposite to each other, the first surface A1 faces an exterior of the electronic device, and the second surface A2 faces an interior of the electronic device. The antenna 12 includes an antenna grain line 121, and the antenna grain line 121 is disposed on the first surface A1.

To be specific, the antenna is disposed in a form of the antenna grain line, and the antenna grain line 121 is disposed on the surface that is of the enclosure 11 and that faces the exterior of the electronic device. Compared with the conventional technology in which an antenna is disposed inside an electronic device, the antenna does not occupy the internal space of the electronic device. This effect is more obvious especially for an electronic device with a large quantity of antennas and limited installation space reserved for the antennas.

In addition, the antenna grain line 121 is disposed on the surface that is of the enclosure 11 and that faces the exterior of the electronic device, which increases a clearance height of the antenna. Compared with the conventional technology in which the antenna is disposed on a surface that is of an enclosure and that faces an interior of the electronic device, an increase amount of the clearance height of the antenna is equal to thickness of the enclosure. Compared with the conventional technology in which the antenna is disposed inside the enclosure, the increase amount of the clearance height of the antenna may be greater than the thickness of the enclosure. Therefore, in an antenna layout manner provided in this embodiment of this application, antenna efficiency can be further improved without occupying the internal space of the electronic device. For example, when the thickness of the enclosure is 0.4 mm to 0.6 mm, the clearance height of the antenna may be increased by at least 0.4 mm to 0.6 mm, and a gain of the antenna may be correspondingly increased by at least 2 dB to 4 dB.

In some implementations, the non-metal part is glass, for example, glass on a front surface of a mobile phone, glass on a back surface of a mobile phone, glass on a front surface of a wearable device, glass on a back surface of a wearable device, or a glass lens of a camera of a mobile phone. For another example, the non-metal part is a plastic sheet. A specific location of the non-metal part is not limited in this application.

Compared with an existing antenna, the antenna grain line provided in this embodiment of this application exists based on a grain feature. Regardless of whether the first surface is a front surface or a back surface of the electronic device, appearance aesthetics is not affected by the antenna, and light transmittance of the front surface or the back surface of the electronic device can be ensured.

Because the antenna grain line 121 is disposed on the surface that is of the enclosure 11 and that faces the exterior of the electronic device, the antenna grain line is easily scratched. To prolong a service life of the antenna grain line, a protective layer 122 is further included. The protective layer 122 covers an exterior of the antenna grain line 121. In other words, the antenna grain line 121 is protected by using the protective layer 122, to prolong the service life of the antenna grain line.

There are a plurality of materials of the protective layer 122. For example, the material of the protective layer 122 is diamond, ceramic, acrylic, silica gel, or the like. The material of the protective layer 122 is not limited in this application, and the protective layer made of any material falls within the protection scope of this application.

In some implementations, thickness of the protective layer 122 ranges from 0.1 μm to 20 μm. In some other implementations, the thickness of the protective layer 122 ranges from 0.1 μm to 10 μm.

Figure 6:
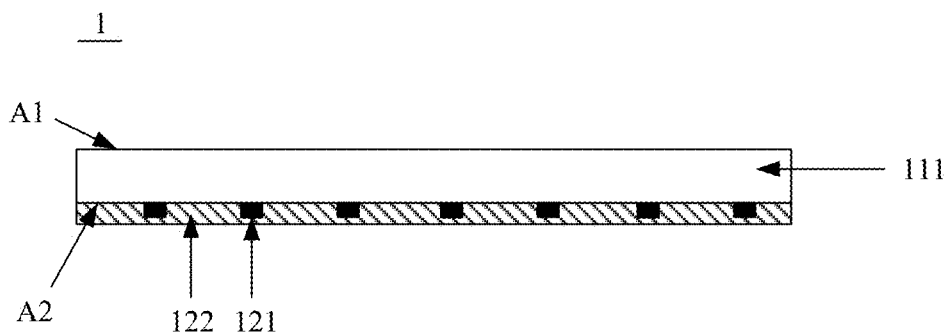
FIG. 6 is a cross-sectional view of an enclosure structure according to an embodiment of this application.

Refer to FIG. 6. To prevent human eyes from seeing the antenna grain line, especially on glass on the front surface of the electronic device, a line width D1 of the antenna grain line 121 ranges from 0.5 μm to 1000 μm, and a spacing D2 between two adjacent branches of the antenna grain line 121 ranges from 5 μm to 1000 μm. An antenna function can be implemented without exposing the antenna grain line to human eyes, and appearance aesthetics of the electronic device is improved. In some other implementations, the line width D1 of the antenna grain line 121 ranges from 1 μm to 200 μm, and the spacing D2 between the two adjacent branches of the antenna grain line 121 ranges from 5 μm to 800 μm. In some other implementations, the line width D1 of the antenna grain line 121 ranges from 1 μm to 40 μm, and the spacing D2 between the two adjacent branches of the antenna grain line 121 ranges from 5 μm to 500 μm.

Figure 10:
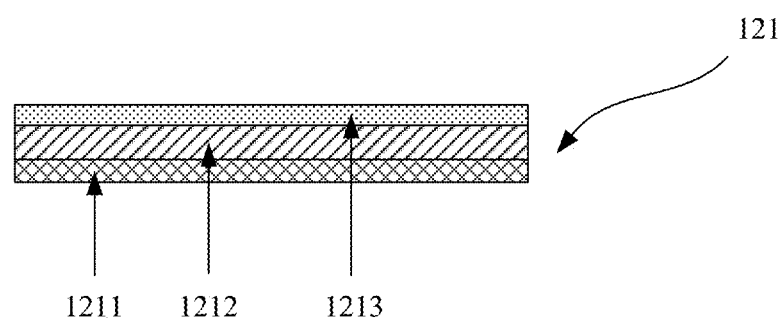
FIG. 10 is a cross-sectional view of an antenna grain line according to an embodiment of this application.

Generally, the antenna grain line 121 includes a conductive layer 1212 (as shown in FIG. 10). The conductive layer is generally made of metals such as gold, silver, copper, and platinum and metal oxides thereof, or may be made by mixing more than two metals and metal oxides thereof. In other words, the conductive layer is made of a conductive material. Bonding force between the conductive material and the non-metal part is small. Consequently, the conductive layer easily falls off. To improve strength of a connection between the conductive layer and the non-metal part, the antenna grain line further includes a transition layer 1211. The conductive layer 1212 is connected to the first surface of the non-metal part by using the transition layer 1211.

There are a plurality of materials of the transition layer 1211, such as TiO2, SiO2, and Ti. Certainly, the transition layer may also be made of another material.

Refer to FIG. 4. The antenna grain line 121 is located inside the protective layer 122, but the thickness of the protective layer 122 only ranges from 0.1 μm to 15 μm. Therefore, a distance between a surface that is of the antenna and that is opposite to the first surface and a surface of the protective layer is very small, namely, only several microns. Consequently, after the protective layer above the antenna is worn out, the antenna is also easily worn out. Therefore, refer to FIG. 10. In addition to the transition layer 1211 and the conductive layer 1212, the antenna grain line 121 further includes a corrosion-resistant layer 1213. The transition layer 1211, the conductive layer 1212, and the corrosion-resistant layer 1213 are disposed in a stacked manner. The corrosion-resistant layer 1213 has three functions: The first function is to prevent the conductive layer 1212 from being corroded and oxidized; the second function is to prevent the conductive layer 1212 from being worn out, to improve scratch resistance performance of the conductive layer; and the third function is to improve the bonding force between the protective layer 122 and the conductive layer 1212.

There are a plurality of materials of the corrosion-resistant layer 1213, for example, metals such as Ni and Ti, or a mixture of metals such as Ni and Ti and oxides thereof. Certainly, the corrosion-resistant layer may also be made of another material.

In some implementations, thickness of the antenna grain line (including the transition layer 1211, the conductive layer 1212, and the corrosion-resistant layer 1213) ranges from 0.1 μm to 10 μm. In some other implementations, the thickness of the antenna grain line ranges from 1 μm to 5 μm.

Figure 11:
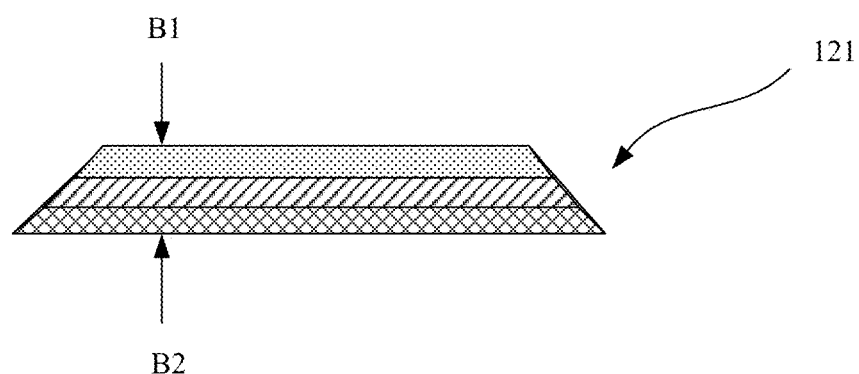
FIG. 11 is a cross-sectional view of an antenna grain line according to an embodiment of this application.

Refer to FIG. 11. To further prolong the service life of the antenna grain line, the antenna grain line 121 has a third surface B1 and a fourth surface B2 that are opposite to each other. The fourth surface B2 is in contact with the first surface of the enclosure, and a vertical projection of the third surface B1 on the fourth surface B2 covers a part of the fourth surface B2. In other words, a cross section of the antenna grain line is of a trapezoidal structure. Compared with a rectangular structure, the trapezoidal structure can improve scratch-resistance performance of the antenna grain line, and prolong the service life of the antenna grain line.

It should be noted that, that the third surface B1 and the fourth surface B2 are opposite to each other means that the third surface B1 and the fourth surface B2 may be parallel; the third surface and the fourth surface are not strictly parallel, but there is a specific angle between the third surface and the fourth surface; or a surface on which the third surface B1 is located intersects a surface on which the fourth surface B2 is located.

Refer to FIG. 3. Because the antenna grain line 121 is located on the surface that is of the enclosure 11 and that faces the exterior of the electronic device, to improve uniformity of light transmittance of the first surface and improve appearance aesthetics of the electronic device, a first area P1 is formed on the first surface, and a second area P2 is an area other than the first area P1 on the first surface. The antenna grain line 121 is located in the first area P1, an auxiliary grain line 13 is formed in the second area P2, the antenna grain line 121 in the first area P1 is connected, and the auxiliary grain line 13 in the second area P2 is disconnected.

That is, the first surface facing the exterior of the electronic device is covered with the antenna grain line and the auxiliary grain line. Regardless of the first area or the second area, compared with a phenomenon that a line is disposed in some areas and no line is disposed in some areas, uniformity of light transmittance of the entire non-metal part can be improved, to avoid a phenomenon that a local area has a color different from those of other areas. In the layout manner of this application, when the first surface is of a glass material, light transmittance of the first surface may be greater than or equal to 75%, to meet a use requirement. In addition, the antenna grain line in the first area is connected, to ensure that a signal can be received and sent; and the auxiliary grain line in the second area is disconnected, so that no signal is received or sent.

It should be noted that, that the antenna grain line 121 in the first area P1 is connected means that the antenna grain line 121 includes a plurality of branches, and the plurality of branches are connected to each other. That the auxiliary grain line 13 in the second area P2 is disconnected means that the auxiliary grain line 13 includes a plurality of branches, and the plurality of branches are disconnected.

Because the antenna grain line is located on the first surface, and the antenna transceiver module is located inside the enclosure, a connection structure needs to be disposed to electrically connect the antenna grain line to the antenna transceiver module. The connection structure has a plurality of implementation structures. The following explains and describes the connection structure by using three embodiments.

Embodiment 1

Figure 12:
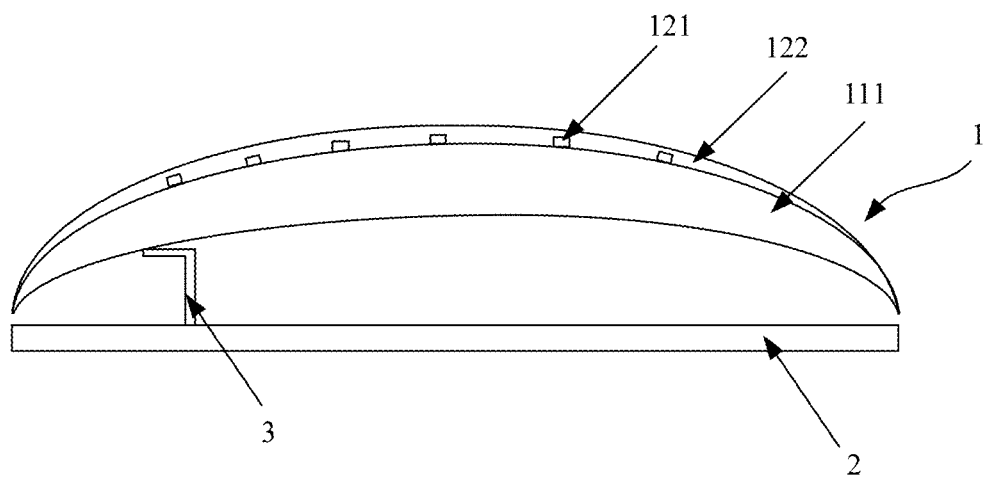
FIG. 12 is a schematic diagram of a connection relationship between an enclosure structure and a circuit board according to an embodiment of this application.
Figure 13:
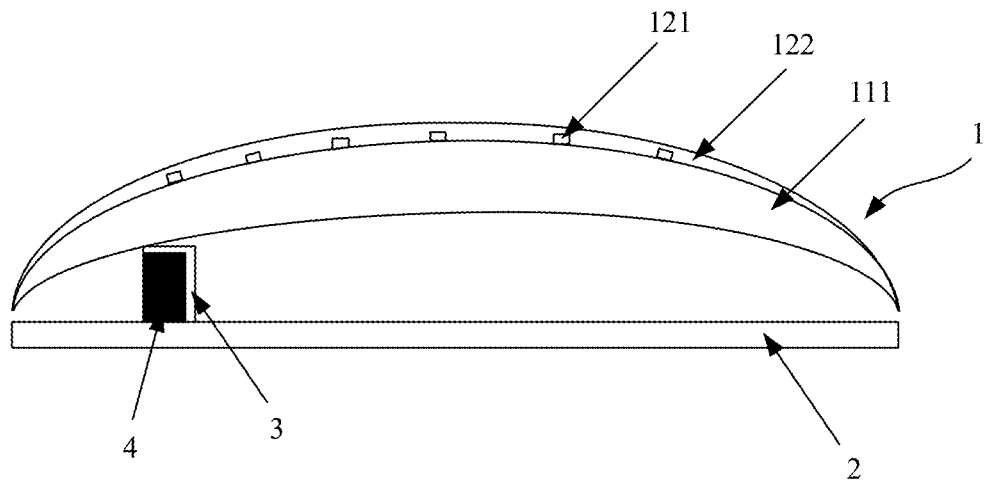
FIG. 13 is a schematic diagram of a connection relationship between an enclosure structure and a circuit board according to an embodiment of this application.

Refer to FIG. 12 and FIG. 13. The antenna grain line 121 is electrically connected to a first signal line 3 through coupled feeding (the first signal line 3 is connected to the antenna transceiver module, and the antenna transceiver module is not shown in the figure).

The antenna grain line is electrically connected to the first signal line through coupled feeding, which has a simple structure and is easy to implement.

It should be noted that, that the antenna grain line is electrically connected to the first signal line through coupled feeding means that the antenna grain line 121 is not in contact with the first signal line 3. In other words, the antenna grain line 121 and the first signal line 3 are in a non-contact electrical connection, and the antenna grain line 121 is electrically connected to the first signal line 3 through galvanic coupling between the antenna grain line 121 and the first signal line 3.

Embodiment 2

Figure 14:
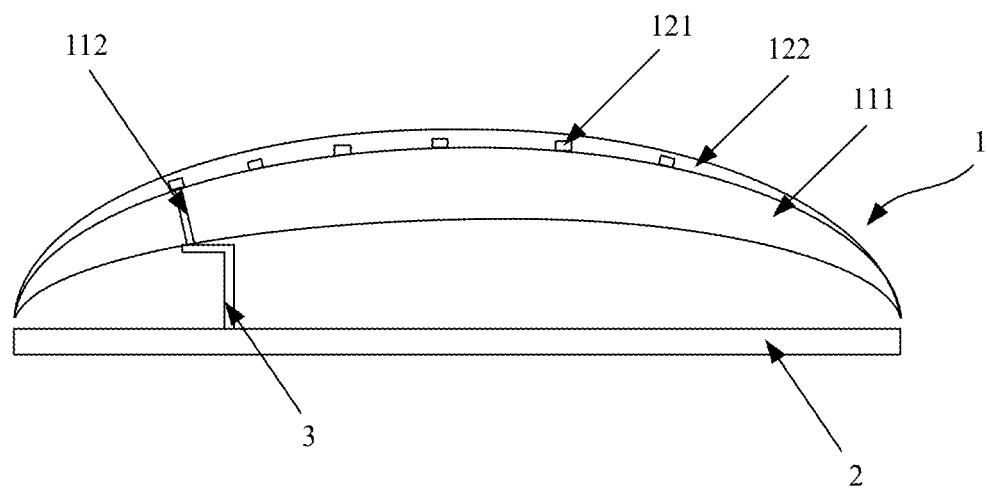
FIG. 14 is a schematic diagram of a connection relationship between an enclosure structure and a circuit board according to an embodiment of this application.
Figure 15:
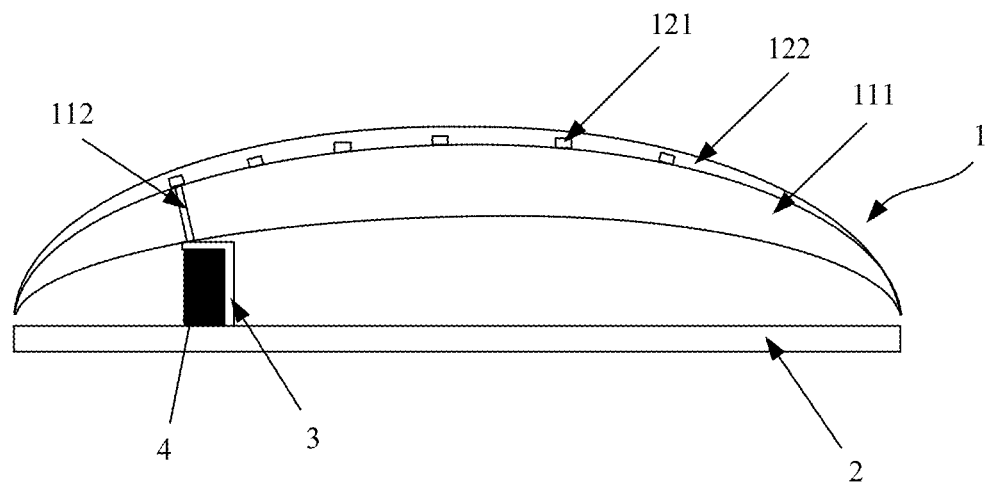
FIG. 15 is a schematic diagram of a connection relationship between an enclosure structure and a circuit board according to an embodiment of this application.

Refer to FIG. 14 and FIG. 15. A conductive through hole 112 is disposed on the non-metal part 111, and the conductive through hole 112 passes through the first surface and the second surface. One end that is of the conductive through hole 112 and that is located on the first surface is electrically connected to the antenna grain line 121 located on the first surface, and one end of that is of the conductive through hole 112 and that is located on the second surface is electrically connected to the first signal line 3.

The conductive through hole is disposed on the non-metal part, to implement that the antenna grain line is electrically connected to the first signal line, which has a simple structure, and is easy to implement.

Embodiment 3

Figure 16:
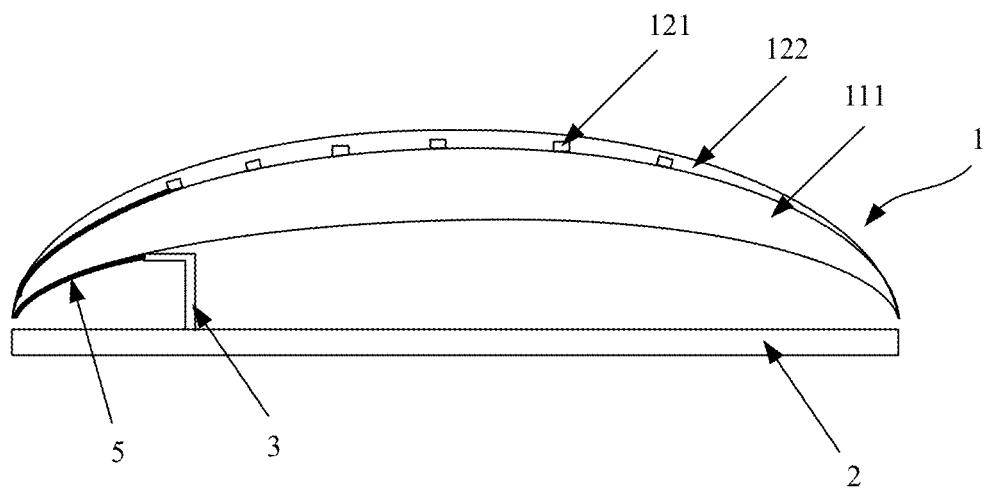
FIG. 16 is a schematic diagram of a connection relationship between an enclosure structure and a circuit board according to an embodiment of this application.
Figure 17:
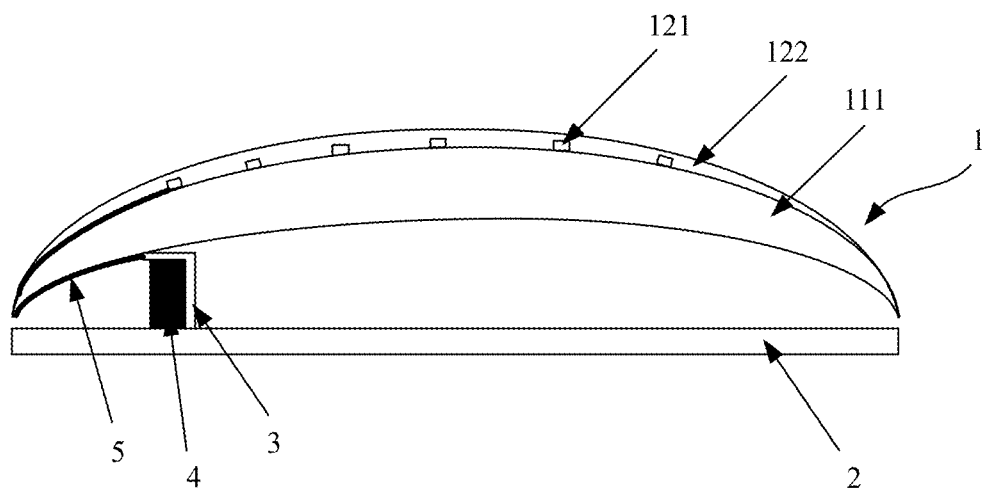
FIG. 17 is a schematic diagram of a connection relationship between an enclosure structure and a circuit board according to an embodiment of this application.

Refer to FIG. 16 and FIG. 17. A second signal line 5 is disposed on the second surface of the non-metal part 111, the second signal line 5 extends to an edge of the second surface and is electrically connected to the antenna grain line 121 located on the first surface, and the first signal line 3 is electrically connected to the second signal line 5 located on the second surface.

An electrical connection between the antenna grain line and the first signal line is implemented by disposing the second signal line on the second surface, extending the second signal line to the edge of the second surface, and electrically connecting the second signal line to the antenna grain line.

It should be noted that, if the antenna grain line on the first surface extends to an edge of the first surface, the second signal line is directly electrically connected to the antenna grain line; and if the antenna grain line on the first surface does not extend to the edge of the first surface, a signal line needs to be disposed at the edge of the first surface. The signal line is electrically connected to the antenna grain line, and is electrically connected to the second signal line on the second surface.

The first signal line has a plurality of implementation structures. For example, refer to FIG. 12. The first signal line 3 is a metal spring. For another example, refer to FIG. 13. The first signal line 3 is a rigid metal sheet, and the rigid metal sheet is disposed on a support 4. In other words, the rigid metal sheet is supported through the support 4. Certainly, the first signal line may alternatively be of another structure.

Figure 18:
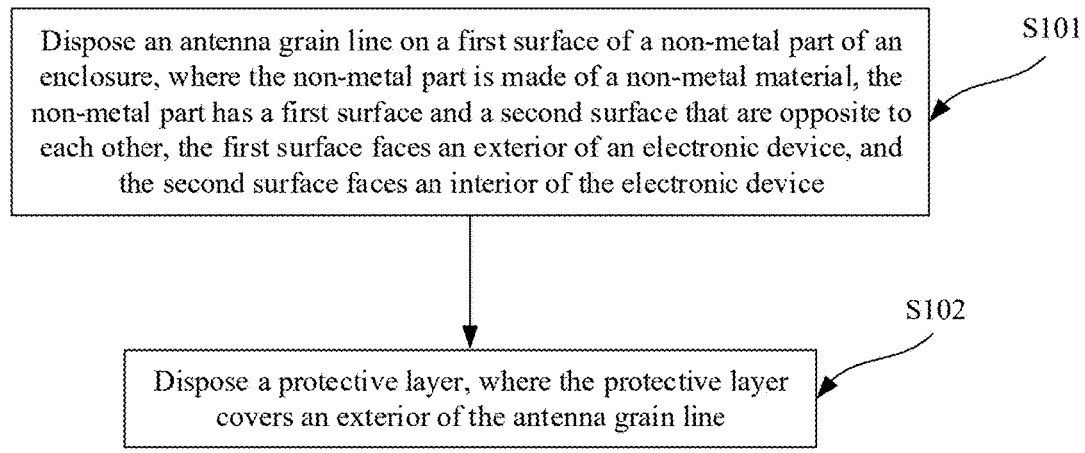
FIG. 18 is a flowchart block diagram of an enclosure structure preparation method according to an embodiment of this application.
Figure 19:
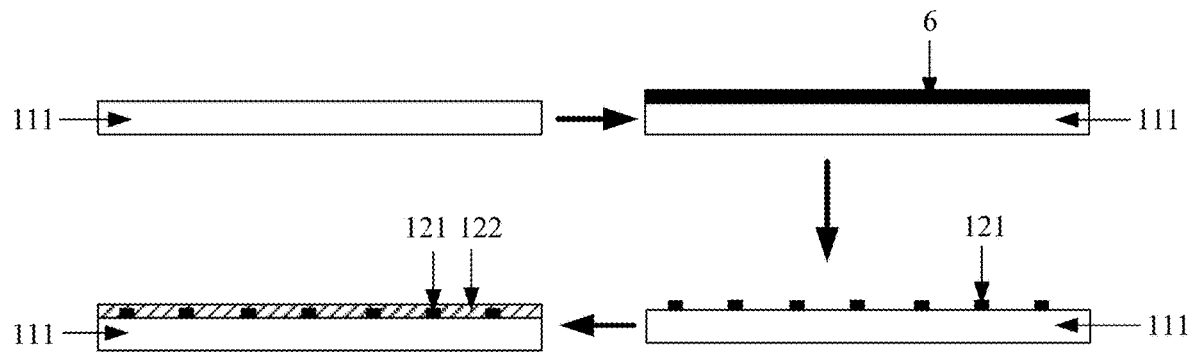
FIG. 19 is a corresponding cross-sectional view after operations in an enclosure structure preparation method are completed according to an embodiment of this application.
Figure 20:
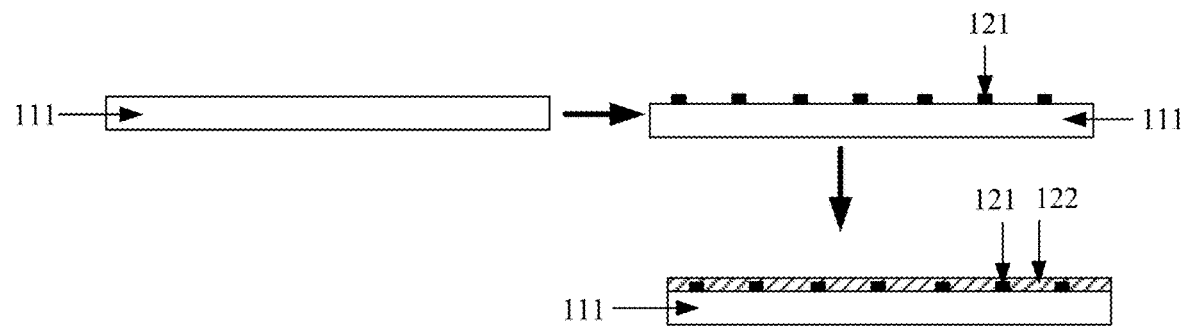
FIG. 20 is a corresponding cross-sectional view after operations in an enclosure structure preparation method are completed according to an embodiment of this application.

An embodiment of this application further provides a preparation method of the enclosure structure shown in FIG. 4. Refer to FIG. 18, FIG. 19, and FIG. 20. The preparation method includes the following operations.

S101: Dispose an antenna grain line 121 on a first surface of a non-metal part 111 of an enclosure, where the non-metal part is made of a non-metal material, the non-metal part has the first surface and a second surface that are opposite to each other, the first surface faces an exterior of an electronic device, and the second surface faces an interior of the electronic device.

S102: Dispose a protective layer 122, where the protective layer 122 covers an exterior of the antenna grain line 121.

In other words, the antenna grain line is disposed on the surface that is of the enclosure and that faces the exterior of the electronic device. In this way, technical effect is as follows: Internal space of the electronic device is not occupied, a clearance height of an antenna may be increased, a gain of the antenna may be increased, and antenna efficiency may be improved.

In addition, it should be noted that the protective layer 122 may not be disposed, so that the prepared enclosure structure does not include the protective layer.

During a specific implementation, there are a plurality of implementations for disposing the antenna grain line 121. The following explains and describes the implementations.

Embodiment 1

Refer to FIG. 19. Disposing the antenna grain line 121 specifically includes:
 covering an antenna film layer 6 on the first surface of the non-metal part 111 of the enclosure; and
 forming the antenna grain line 121 on the antenna film layer 6. For example, the antenna grain line 121 may be prepared on the antenna film layer 6 through etching or laser engraving. For another example, the antenna grain line 121 may be formed in an exposure development manner.

In addition, covering the antenna film layer on the first surface of the non-metal part includes but is not limited to using a process method such as vacuum evaporation, sputtering, ion plating, electroplating, or transfer printing.

Embodiment 2

Refer to FIG. 20. Disposing the antenna grain line 121 specifically includes: performing transfer printing, screen printing, spray coating, or exposure development on the first surface of the non-metal part 111, to form the antenna grain line 121.

In a transfer printing, screen printing, or spray coating process, conductive materials such as nanosilver paste are not limited for using.

In an exposure development process, a line grain is obtained by applying glue to the non-metal part, performing exposure, and photoetching, and then the antenna film layer is covered. Finally, the antenna film layer on the glue is removed when the glue is removed, and the antenna grain line is finally formed.

In some implementations, to improve uniformity of light transmittance of the first surface, the disposing an antenna grain line on a first surface of a non-metal part 111 includes:
dividing the first surface into a first area and a second area, where the second area is an area other than the first area on the first surface;
preparing the antenna grain line in the first area, where the antenna grain line is connected; and
preparing an auxiliary grain line in the second area, where the auxiliary grain line is disconnected.

During a specific implementation, the entire first surface may be covered with the antenna film layer, and the grain lines are formed on the antenna film layer. Disconnection processing is performed on the grain line located in the second area. In other words, a part of the grain line is disconnected, to form the disconnected auxiliary grain line in the second area. The grain line in the first area does not need to be disconnected, to form the connected antenna grain line in the first area.

The first area and the second area may be divided based on a location of an antenna transceiver module in the electronic device. To be specific, the first area is close to the antenna transceiver module. In this way, it is convenient to implement an electrical connection between the antenna grain line and the antenna transceiver module.

When the protective layer is disposed, a process method includes, for example, but is not limited to spray coating, flow coating, or dip coating.

The covering an antenna film layer on the first surface of the non-metal part specifically includes:
covering the first surface with a transition layer; covering the transition layer with a conductive layer; and covering the conductive layer with a corrosion-resistant layer, to form the antenna film layer.

Figure 5:
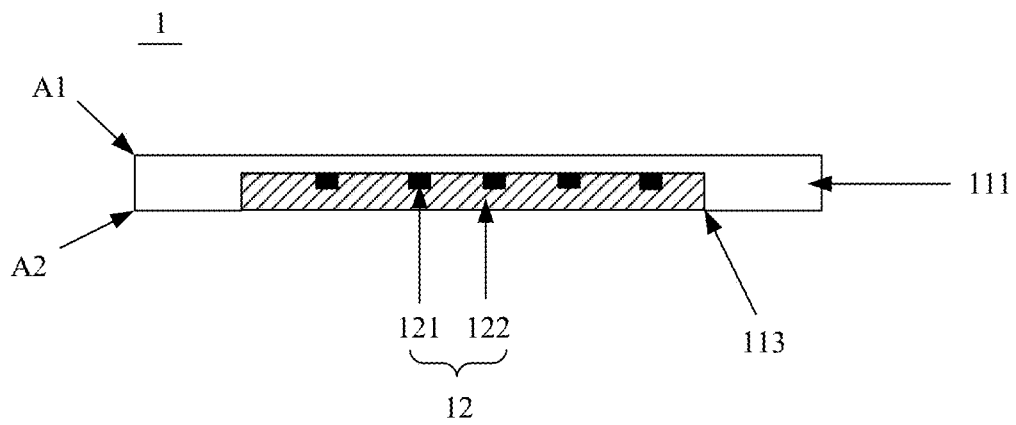
FIG. 5 is a cross-sectional view of an enclosure structure according to an embodiment of this application.

To prevent the antenna from occupying the internal space of the electronic device, and to increase the clearance height of the antenna and improve antenna efficiency, an embodiment of this application further provides an enclosure structure. The enclosure structure is used as the enclosure of the electronic device. Refer to FIG. 2 and FIG. 3. The enclosure structure 1 includes the enclosure 11 and the antenna 12, where the enclosure 11 includes the non-metal part 111, and the non-metal part 111 is made of a non-metal material (for example, glass or plastic). Refer to FIG. 5. The non-metal part 111 has the first surface A1 and the second surface A2 that are opposite to each other, the first surface A1 faces the exterior of the electronic device, the second surface A2 faces the interior of the electronic device, a groove 113 is disposed on the second surface A2, and the antenna grain line 121 is disposed in the groove 113.

In other words, the antenna grain line is disposed on the surface that is of the enclosure and that faces the interior of the electronic device, and the antenna grain line is disposed in the groove on the second surface. Compared with the conventional technology in which an antenna is disposed on a surface that is of an enclosure and that faces an interior of an electronic device, the antenna grain line does not occupy the internal space of the electronic device. This effect is more obvious especially for an electronic device with a large quantity of antennas and limited installation space reserved for the antennas. In addition, in an antenna layout manner provided in this embodiment, the clearance height of the antenna is also increased, and an increase amount of the clearance height of the antenna is equal to thickness of the enclosure minus a groove depth of the groove. Therefore, in the antenna layout manner provided in this embodiment of this application, antenna efficiency can be further improved without occupying the internal space of the electronic device.

In some implementations, the non-metal part is glass, for example, glass on a front surface of a mobile phone, glass on a back surface of a mobile phone, glass on a front surface of a wearable device, or glass on a back surface of a wearable device. For another example, the non-metal part is a plastic sheet or the like. A specific location of the non-metal part is not limited in this application.

In some implementations, the enclosure structure of the electronic device further includes a protective layer 122. The protective layer 122 covers an exterior of the antenna grain line 121. In other words, the antenna grain line 121 is protected by using the protective layer 122, to prolong a service life of the antenna grain line.

There are a plurality of materials of the protective layer 122. For example, the material of the protective layer 122 is diamond, ceramic, acrylic, silica gel, or the like. The material of the protective layer 122 is not limited in this application, and the protective layer made of any material falls within the protection scope of this application. The protective layer may be transparent, or may be opaque. In this application, the protective layer is preferably transparent.

In some implementations, thickness of the protective layer 122 ranges from 0.1 μm to 20 μm. In other implementations, the thickness of the protective layer 122 ranges from 0.1 m to 15 m.

A line width D1 of the antenna grain line 121 ranges from 0.5 μm to 1000 μm, and a spacing D2 between two adjacent branches of the antenna grain line 121 ranges from 5 μm to 1000 μm. When the enclosure is of a transparent structure, the antenna grain line cannot be seen from the outside of the enclosure. In this way, appearance aesthetics of the electronic device is improved. In some other implementations, the line width D1 of the antenna grain line 121 ranges from 1 μm to 200 μm, and the spacing D2 between the two adjacent branches of the antenna grain line 121 ranges from 5 μm to 800 μm. The antenna grain line 121 is located inside the protective layer 122. In other words, the antenna grain line 121 is protected by using the protective layer 122, to prolong the service life of the antenna grain line.

The antenna grain line includes, in a direction from approaching the enclosure to away from the enclosure, the transition layer, the conductive layer, and the corrosion-resistant layer that are disposed in a stacked manner. Certainly, the antenna grain line may also include another structure.

Refer to FIG. 11. To further prolong the service life of the antenna grain line, the antenna grain line 121 has a third surface B1 and a fourth surface B2 that are opposite to each other. The fourth surface B2 is in contact with the second surface of the enclosure, and a vertical projection of the third surface B1 on the fourth surface B2 covers a part of the fourth surface B2. In other words, a cross section of the antenna grain line is of a trapezoidal structure. Compared with a rectangular structure, the trapezoidal structure can improve scratch-resistance performance of the antenna grain line, and prolong the service life of the antenna grain line.

Because the antenna is disposed on an inner surface of the enclosure (in other words, in the groove on the second surface), the antenna grain line may be electrically connected to a first signal line through coupled feeding (the first signal line is connected to the antenna transceiver module). A structure is simple, and the internal space of the enclosure is not occupied due to another disposed structure.

In some implementations, the groove depth of the groove ranges from 1 mm to 2 mm. In some other implementations, the groove depth of the groove ranges from 0.1 mm to 0.4 mm.

In an implementation, a third area and a fourth area are formed on a bottom surface of the groove, the fourth area is an area other than the third area in the groove, the antenna grain line is formed in the third area, an auxiliary grain line is formed in the fourth area, the antenna grain line is connected, and the auxiliary grain line is disconnected. Because the antenna grain is disposed on the entire bottom surface of the groove, when the non-metal part is of a transparent structure, light transmittance of the entire non-metal part may be uniform.

Figure 21:
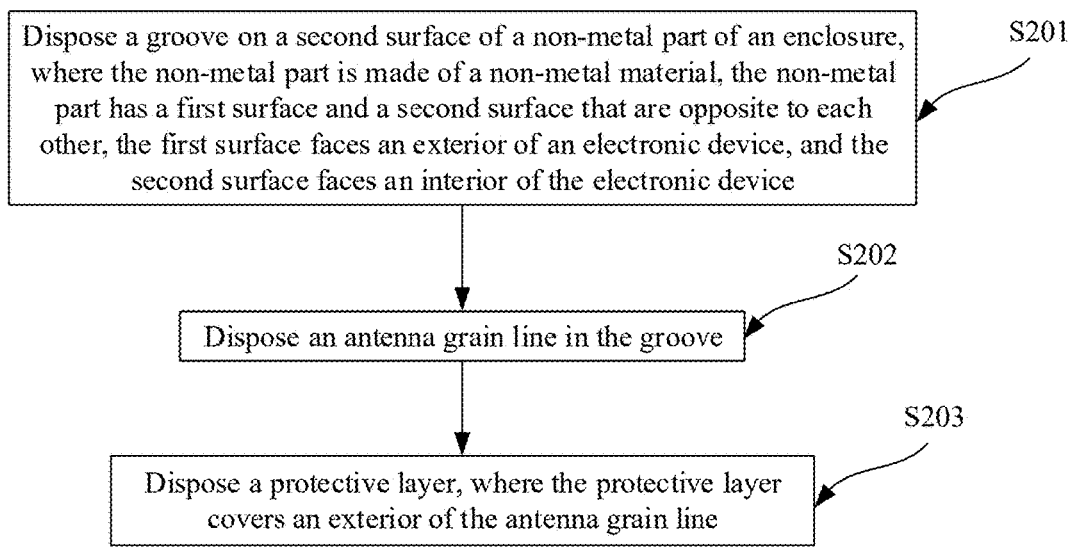
FIG. 21 is a flowchart block diagram of an enclosure structure preparation method according to an embodiment of this application.
Figure 22:
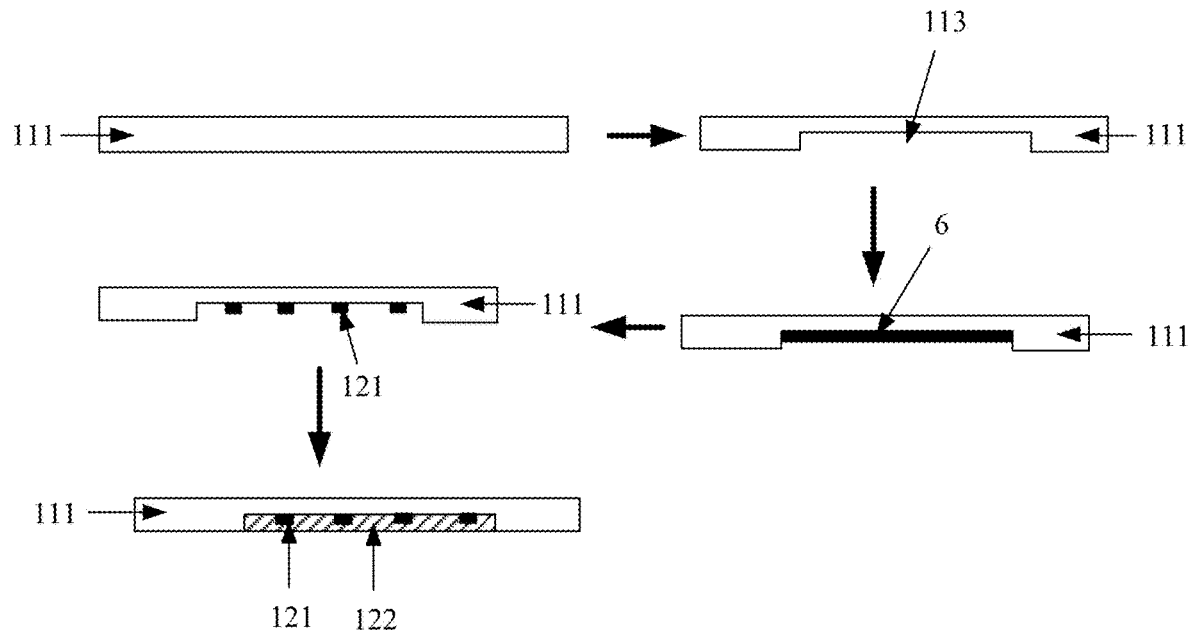
FIG. 22 is a corresponding cross-sectional view after operations in an enclosure structure preparation method are completed according to an embodiment of this application.

An embodiment of this application further provides a preparation method of the enclosure structure shown in FIG. 5. Refer to FIG. 21, FIG. 22, and FIG. 23. The preparation method includes the following operations.

S201: Dispose a groove 113 on a second surface of a non-metal part 111 of an enclosure, where the non-metal part is made of a non-metal material, the non-metal part has a first surface and a second surface that are opposite to each other, the first surface faces an exterior of an electronic device, and the second surface faces an interior of the electronic device.

S202: Dispose an antenna grain line 121 in the groove 113.

S203: Dispose a protective layer 122, where the protective layer 122 covers an exterior of the antenna grain line 121.

In other words, an antenna is disposed in the groove on the surface that is of the enclosure and that faces the interior of the electronic device. In this way, technical effect is as follows: Internal space of the electronic device is not occupied, a clearance height of the antenna may be increased, a gain of the antenna may be increased, and antenna efficiency may be improved.

In addition, it should be noted that the protective layer 122 may not be disposed, so that the prepared enclosure structure does not include the protective layer.

When the groove 113 is disposed on the second surface of the non-metal part 111 of the enclosure, dry etching or wet etching may be used. Certainly, another process may also be used.

When the antenna grain line 121 is disposed in the groove 113, there are a plurality of implementations for disposing the antenna grain line 121. The following explains and describes the implementations.

Embodiment 1

Refer to FIG. 22. Disposing the antenna grain line 121 specifically includes:
covering an antenna film layer 6 in the groove 113; and
forming the antenna grain line 121 on the antenna film layer 6. For example, the antenna grain line 121 may be prepared on the antenna film layer 6 through etching or laser engraving. For another example, the antenna grain line 121 may be formed in an exposure development manner.

Embodiment 2

Refer to FIG. 23. Disposing the antenna grain line 121 specifically includes: performing transfer printing, screen printing, spray coating, or exposure development in the groove 113, to form the antenna grain line 121.

It should be noted that, for a process method for disposing the protective layer, the foregoing process used for preparing the enclosure structure shown in FIG. 4 may be used. Certainly, the process may alternatively not be used.

In an implementation, when the groove is disposed, an area of a bottom surface of the groove may be greater than an area of the antenna grain line. In this case, an auxiliary grain line also needs to be disposed in the groove. When the non-metal part is of a transparent structure, light transmittance of the non-metal part is uniform by disposing the grain lines on the entire bottom surface of the groove.

An embodiment of this application further provides an enclosure structure. The enclosure structure is used as the enclosure of the electronic device. Refer to FIG. 2 and FIG. 3. The enclosure structure 1 includes the enclosure 11 and the antenna 12, and at least a part of the enclosure 11 is made of a non-metal material (for example, glass or plastic), to form the non-metal part 111. Refer to FIG. 6. The non-metal part 111 has the first surface A1 and the second surface A2 that are opposite to each other, the first surface A1 faces the exterior of the electronic device, the second surface A2 faces the interior of the electronic device, and the antenna grain line 121 is disposed on the second surface A2.

In addition, a fifth area is formed on the second surface A2, a sixth area is an area other than the fifth area on the second surface A2, the antenna grain line 121 is located in the fifth area, an auxiliary grain line 13 is formed in the sixth area, the antenna grain line 121 in the fifth area is connected, and the auxiliary grain line 13 in the sixth area is disconnected.

In other words, the grain lines are disposed on the entire second surface. The antenna grain line in the first area is connected, and can receive and transmit an antenna signal; and the auxiliary grain line in the second area is disconnected, and cannot receive and transmit an antenna signal. When both the first area and the second area have the grain lines, light transmittance of the entire second surface is uniform. If the enclosure is of a transparent structure, a phenomenon that a local area has a color different from those of other areas cannot be seen from the outside of the enclosure. Therefore, in the enclosure structure provided in this embodiment of this application, appearance aesthetics is further comprehensively considered on a basis of implementing an antenna function.

In addition, a protective layer 122 is included outside the antenna grain line 121 and the auxiliary grain line 13, and the protective layer 122 may use an existing shield layer (for example, an ink layer or a lamination diaphragm) to protect the antenna grain line and the auxiliary grain line. In other words, the antenna grain line and the auxiliary grain line are inside the existing shield layer.

Line widths D1 of the antenna grain line 121 and the auxiliary grain line 13 each range from 0.5 μm to 1000 μm, and spacings D2 between two adjacent branches of the antenna grain line 121 and the auxiliary grain line 13 each range from 5 μm to 1000 μm. In some other implementations, the line widths D1 of the antenna grain line 121 and the auxiliary grain line 13 each range from 1 μm to 200 μm, and the spacings D2 between the two adjacent branches of the antenna grain line 121 and the auxiliary grain line 13 each range from 5 μm to 800 μm.

In addition, the antenna grain line and the auxiliary grain line each include a transition layer, a conductive layer, and a corrosion-resistant layer that are disposed in a stacked manner. Certainly, the antenna grain line and the auxiliary grain line may also include another structure.

Because the antenna is disposed on an inner surface of the enclosure (namely, the second surface), the antenna grain line may be electrically connected to a first signal line through coupled feeding (the first signal line is connected to an antenna transceiver module). A structure is simple, and internal space of the enclosure is not occupied due to another disposed structure.

An embodiment of this application further provides a preparation method of the enclosure structure shown in FIG. 6. Refer to FIG. 24. The preparation method includes the following operations.

S301: Divide a second surface into a fifth area and a sixth area, where the fifth area is an area other than the fifth area on the second surface, an antenna grain line is formed in the fifth area, an auxiliary grain line is formed in the sixth area, the antenna grain line in the fifth area is connected, and the auxiliary grain line in the sixth area is disconnected; and a non-metal part is made of a non-metal material, the non-metal part has a first surface and a second surface that are opposite to each other, the first surface faces an exterior of an electronic device, and the second surface faces an interior of the electronic device.

S302: Dispose a protective layer 122, where the protective layer 122 covers exteriors of the antenna grain line 121 and the auxiliary grain line.

When the antenna grain line and the auxiliary grain line are disposed on the second surface, there are a plurality of implementations. The following explains and describes the implementations.

Embodiment 1

Refer to FIG. 25. Disposing the antenna grain line and the auxiliary grain line specifically includes:
covering an antenna film layer 6 on the second surface; and
forming the grain line on the antenna film layer. For example, the grain line may be prepared on the antenna film layer 6 through etching or laser engraving. For another example, the grain line may be formed in an exposure development manner.

Further, disconnection processing is performed on the grain line in the sixth area, to form the auxiliary grain line in the sixth area.

Embodiment 2

Figure 26:
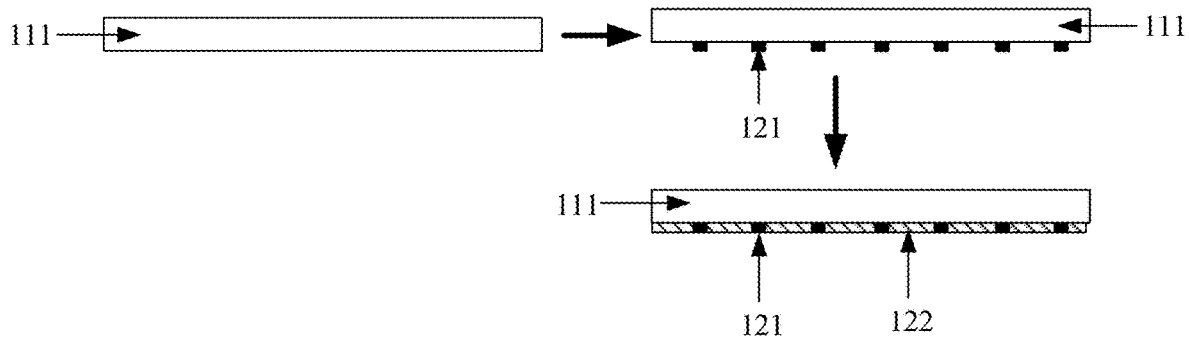
FIG. 26 is a corresponding cross-sectional view after operations in an enclosure structure preparation method are completed according to an embodiment of this application.

Refer to FIG. 26. Disposing the antenna grain line 121 and the auxiliary grain line specifically includes: performing transfer printing, screen printing, spray coating, or exposure development on the second surface, to form the grain line on the second surface; and performing disconnection processing on the grain line in the sixth area, to form the auxiliary grain line in the sixth area.

Figure 7:
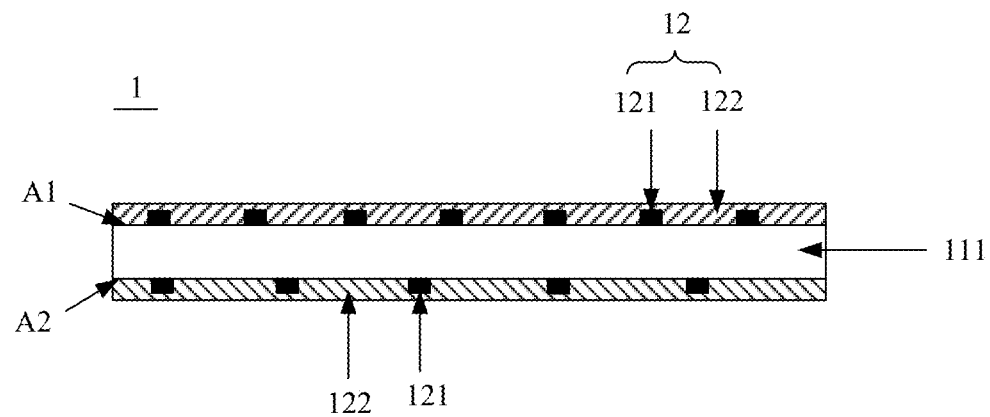
FIG. 7 is a cross-sectional view of an enclosure structure according to an embodiment of this application.

When there are a plurality of antennas, refer to FIG. 7. The antenna grain line 121 is disposed on the first surface A1, and the antenna grain line 121 is also disposed on the second surface A2.

Figure 27:
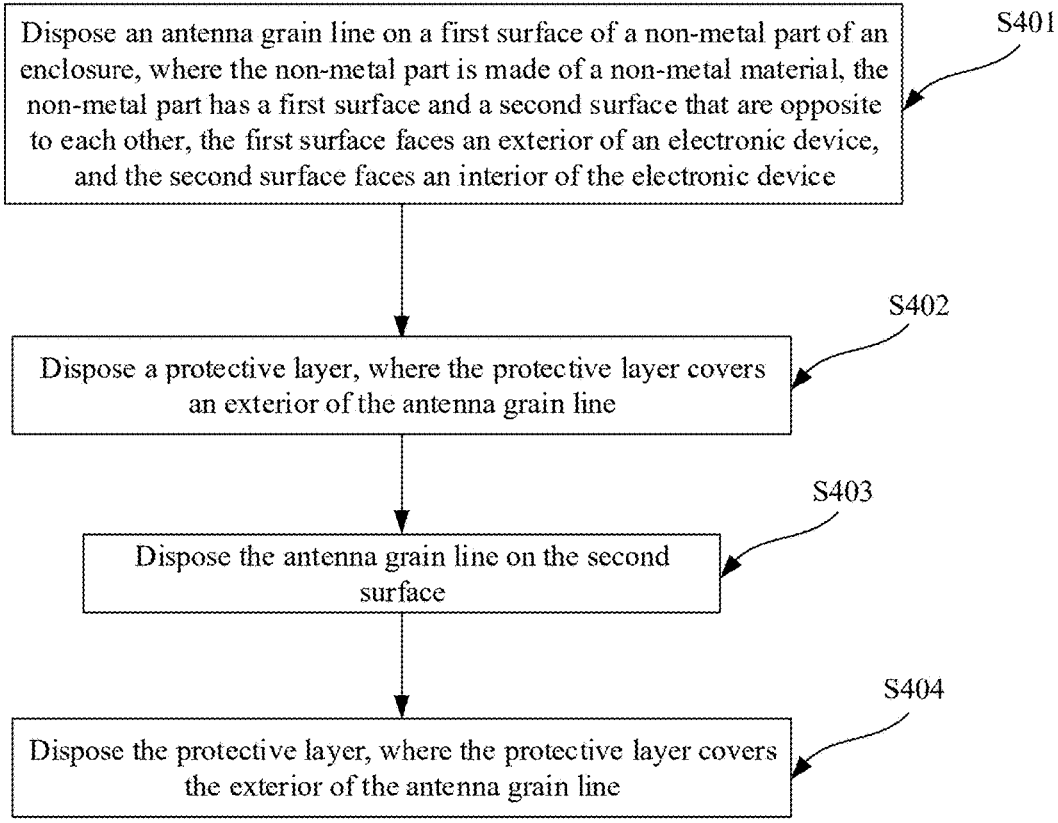
FIG. 27 is a flowchart block diagram of an enclosure structure preparation method according to an embodiment of this application.

An embodiment of this application further provides an enclosure structure preparation method. Refer to FIG. 27. The preparation method includes the following operations.

S401: Dispose an antenna grain line 121 on a first surface of a non-metal part 111 of an enclosure, where the non-metal part is made of a non-metal material, the non-metal part has a first surface and a second surface that are opposite to each other, the first surface faces an exterior of an electronic device, and the second surface faces an interior of the electronic device.

S402: Dispose a protective layer 122, where the protective layer 122 covers an exterior of the antenna grain line 121.

S403: Dispose the antenna grain line 121 on the second surface of the non-metal part 111 of the enclosure.

S404: Dispose the protective layer 122, where the protective layer 122 covers the exterior of the antenna grain line 121.

It should be noted that the antenna grain line may alternatively be disposed on the second surface first, and then the grain line is disposed on the first surface. It should be understood that the first surface may include a first area with the antenna grain line, and a second area with an auxiliary grain line. The second surface may include a fifth area with the antenna grain line, and the sixth area with the auxiliary grain line.

When the antenna grain line is disposed on the first surface and the second surface, there are a plurality of implementations for disposing the antenna grain line. The following explains and describes the implementations.

Embodiment 1

Figure 28:
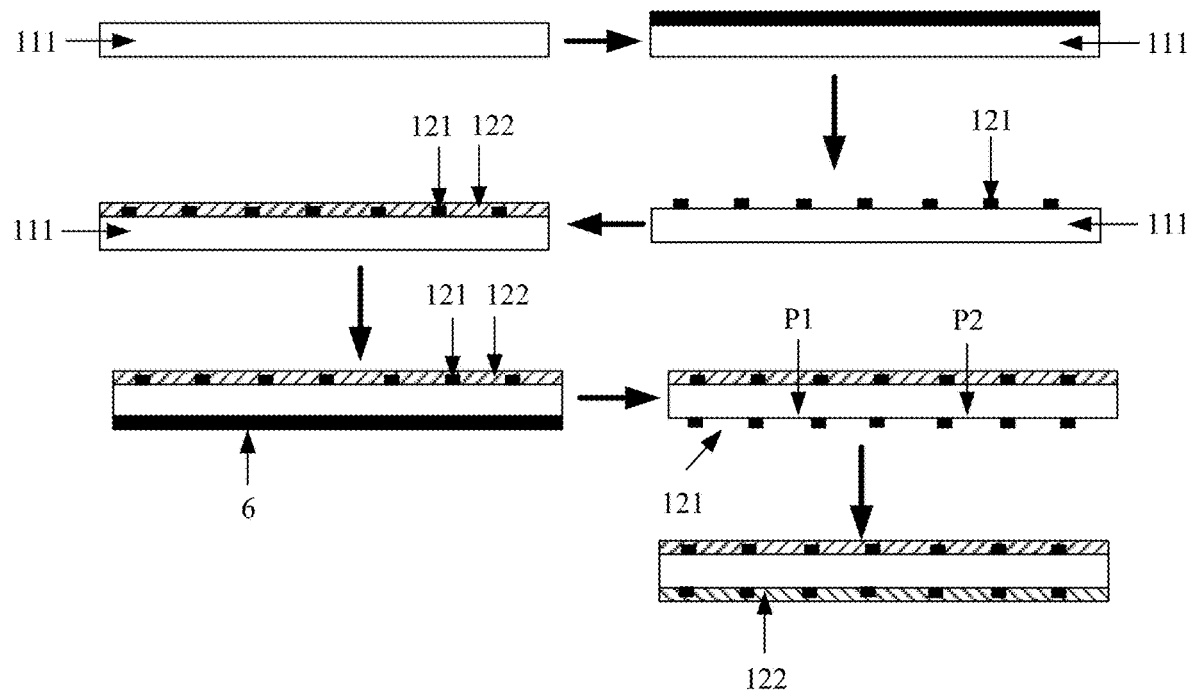
FIG. 28 is a corresponding cross-sectional view after operations in an enclosure structure preparation method are completed according to an embodiment of this application.

Refer to FIG. 28. Disposing the antenna grain line specifically includes:
covering an antenna film layer 6 on the first surface and the second surface; and forming the antenna grain line 121 on the antenna film layer 6 on the first surface, and forming the antenna grain line 121 on the antenna film layer 6 on the second surface. For example, the antenna grain line 121 may be prepared on the antenna film layer 6 through etching or laser engraving. For another example, the antenna grain line 121 may be formed in an exposure development manner.

Embodiment 2

Figure 29:
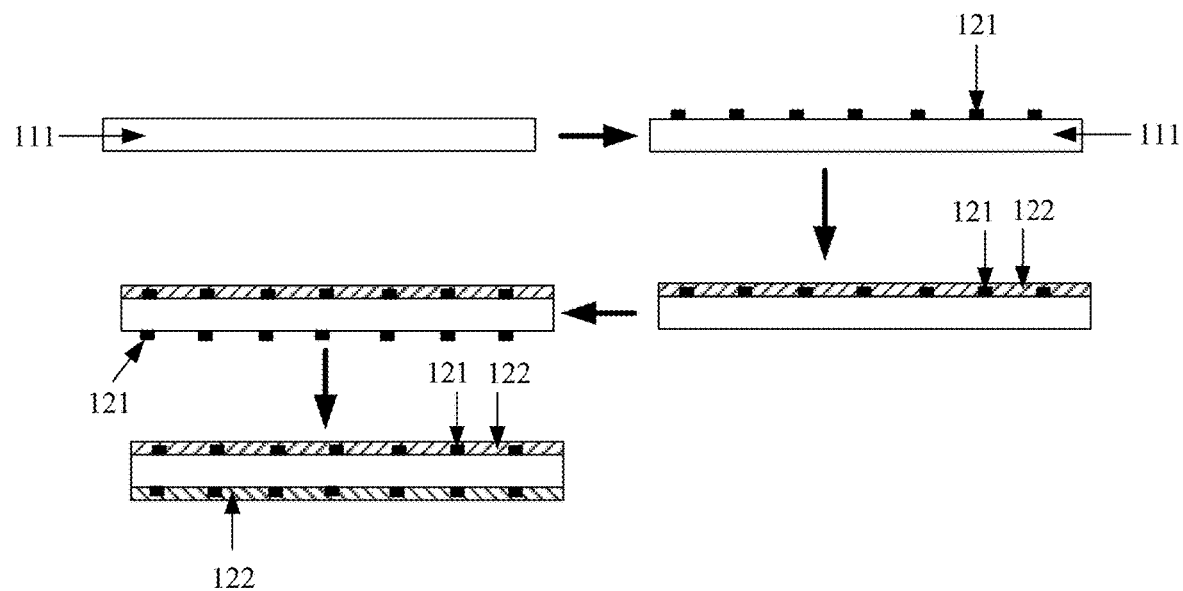
FIG. 29 is a corresponding cross-sectional view after operations in an enclosure structure preparation method are completed according to an embodiment of this application.

Refer to FIG. 29. Disposing the antenna grain line specifically includes: performing transfer printing, screen printing, spray coating, or exposure development on the first surface and the second surface, to form the antenna grain line 121.

Figure 8:
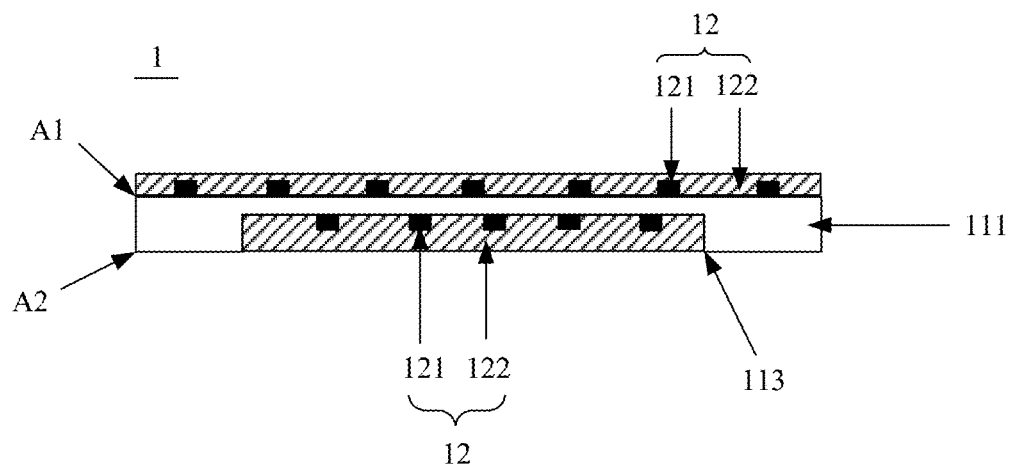
FIG. 8 is a cross-sectional view of an enclosure structure according to an embodiment of this application.
Figure 9:
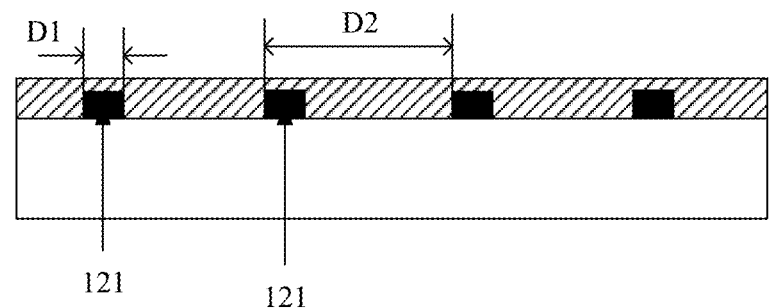
FIG. 9 is a cross-sectional view of an enclosure structure according to an embodiment of this application.
Figure 30:
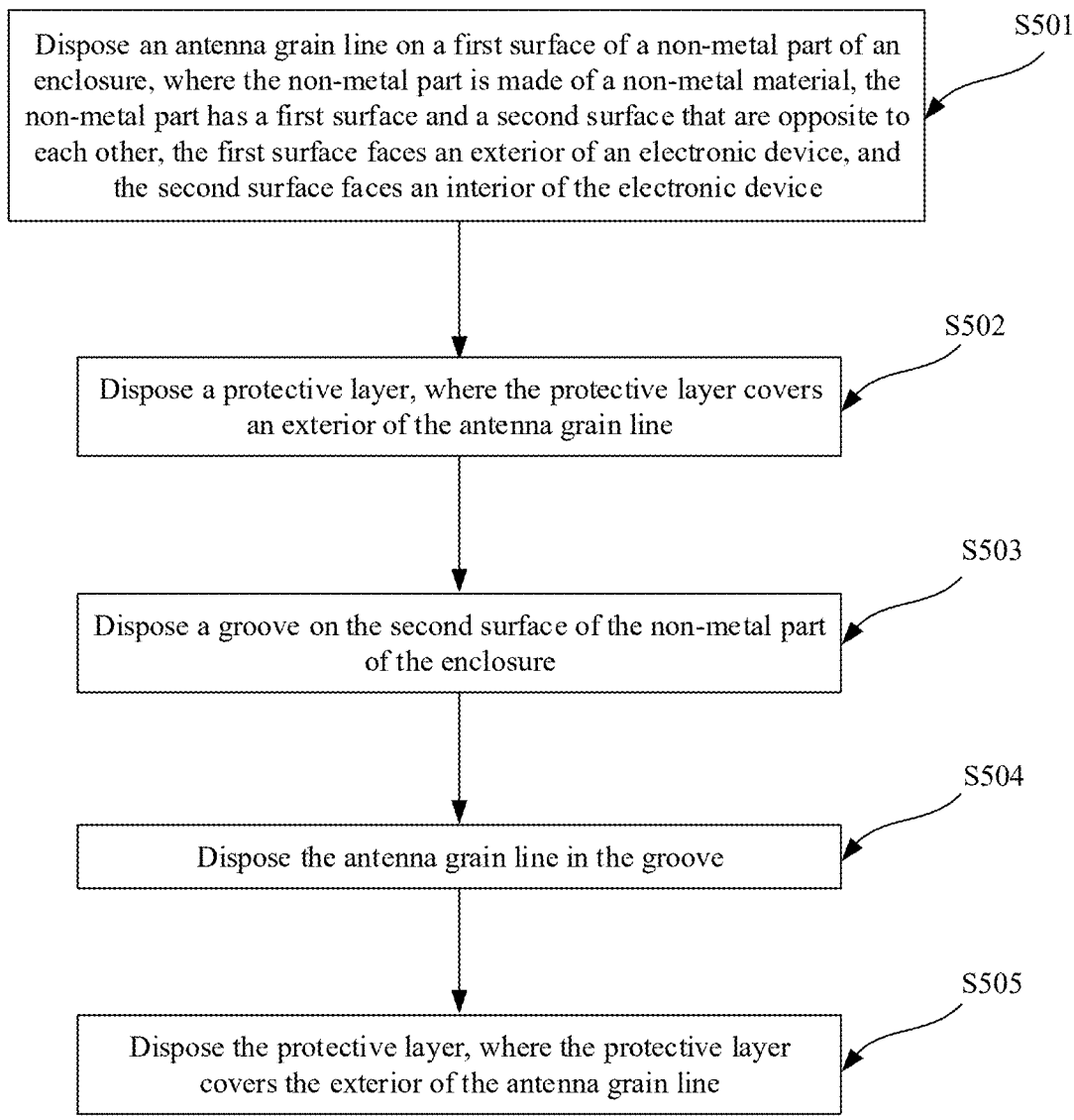
FIG. 30 is a flowchart block diagram of an enclosure structure preparation method according to an embodiment of this application.

An embodiment of this application further provides a preparation method of the enclosure structure shown in FIG. 8. Refer to FIG. 30. The preparation method includes the following operations.

S501: Dispose an antenna grain line 121 on a first surface of a non-metal part 111 of an enclosure, where the non-metal part is made of a non-metal material, the non-metal part has a first surface and a second surface that are opposite to each other, the first surface faces an exterior of an electronic device, and the second surface faces an interior of the electronic device.

S502: Dispose a protective layer 122, where the protective layer 122 covers an exterior of the antenna grain line 121.

S503: Dispose a groove 113 on the second surface of the non-metal part 111 of the enclosure.

S504: Dispose the antenna grain line 121 in the groove 113.

S505: Dispose the protective layer 122, where the protective layer 122 covers the exterior of the antenna grain line 121.

It should be noted that the antenna grain line may alternatively be disposed in the groove first, and then the grain line is disposed on the first surface.

When the antenna grain line is disposed on the first surface and the second surface, there are a plurality of implementations for disposing the antenna grain line. The following explains and describes the implementations.

Embodiment 1

Figure 31:
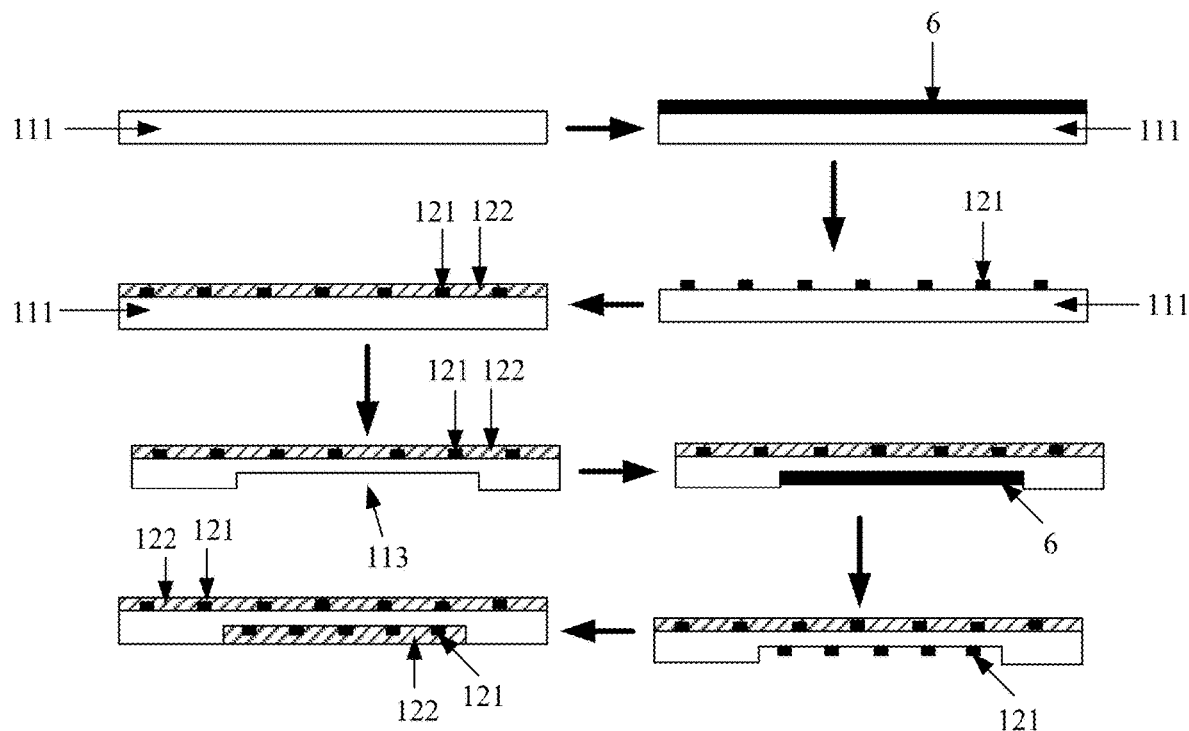
FIG. 31 is a corresponding cross-sectional view after operations in an enclosure structure preparation method are completed according to an embodiment of this application.

Refer to FIG. 31. Disposing the antenna grain line 121 specifically includes:

covering an antenna film layer 6 on the first surface and the second surface; and forming the antenna grain line 121 on the antenna film layer 6. For example, the antenna grain line 121 may be prepared on the antenna film layer 6 through etching or laser engraving. For another example, the antenna grain line 121 may be formed in an exposure development manner.

Embodiment 2

Figure 32:
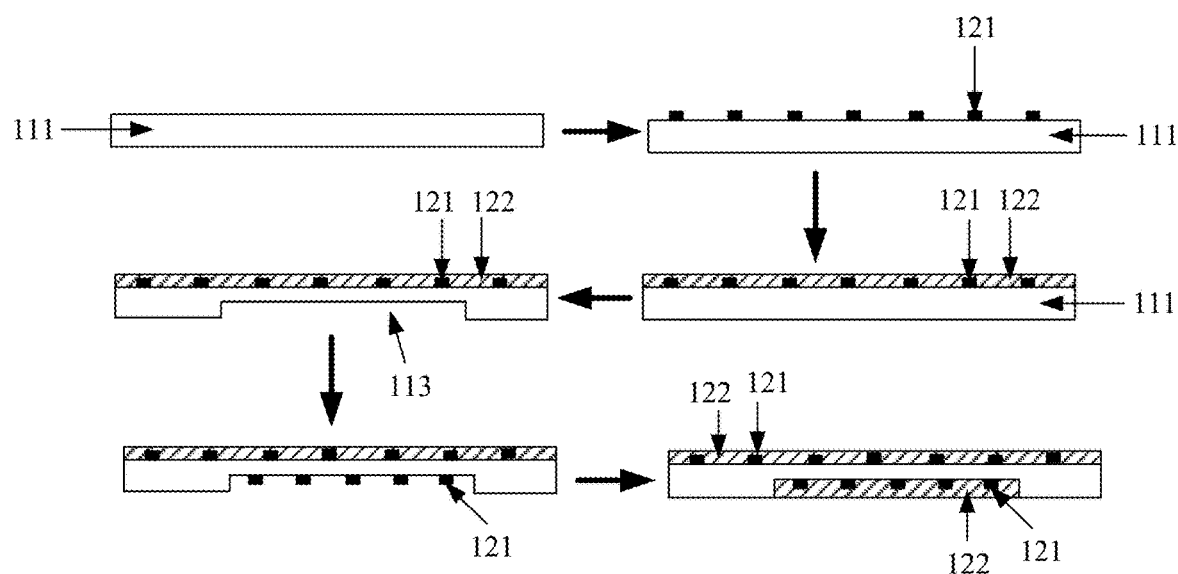
FIG. 32 is a corresponding cross-sectional view after operations in an enclosure structure preparation method are completed according to an embodiment of this application.

Refer to FIG. 32. Disposing the antenna grain line 121 specifically includes: performing transfer printing, screen printing, spray coating, or exposure development on the first surface and the second surface, to form the antenna grain line 121.

In the descriptions of this specification, the described specific features, structures, materials, or characteristics may be combined in a proper manner in any one or more of embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An enclosure structure of an electronic device, comprising:

an enclosure, comprising a non-metal part made of a non-metal material, wherein the non-metal part has a first surface and a second surface that are opposite to each other, wherein the first surface faces an exterior of the electronic device, and wherein the second surface faces an interior of the electronic device; and an antenna grain line disposed on the first surface; or a groove disposed on the second surface, wherein the antenna grain line is disposed in the groove, wherein the antenna grain line comprises, in a direction away from the enclosure, a transition layer, a conductive layer, and a corrosion-resistant layer that are disposed in a stacked manner.

2. The enclosure structure according to claim 1, further comprising:

a protective layer that covers an exterior of the antenna grain line.

3. The enclosure structure according to claim 1, wherein the antenna grain line has a third surface and a fourth surface that are opposite to each other, wherein the fourth surface is in contact with the enclosure, and wherein a vertical projection of the third surface on the fourth surface covers a part of the fourth surface.

4. The enclosure structure according to claim 1, wherein a line width of the antenna grain line ranges from 0.5 µm to 1000 µm, and a spacing between two adjacent branches of the antenna grain line ranges from 5 µm to 1000 µm.

5. The enclosure structure according to claim 1, wherein when the antenna grain line is disposed on the first surface, a first area is formed on the first surface, wherein a second area is an area other than the first area on the first surface, wherein the antenna grain line on the first surface is located in the first area, wherein an auxiliary grain line is disposed in the second area, wherein the antenna grain line in the first area is connected, and wherein the auxiliary grain line in the second area is disconnected.

6. The enclosure structure according to claim 1, wherein when the antenna grain line is disposed in the groove, a bottom surface of the groove comprises a third area and a fourth area, wherein the fourth area is an area other than the third area on the bottom surface of the groove, wherein the antenna grain line in the groove is located in the third area, wherein an auxiliary grain line is disposed in the fourth area, wherein the antenna grain line in the third area is connected, and wherein the auxiliary grain line in the fourth area is disconnected.

7. The enclosure structure according to claim 1, wherein when the antenna grain line is disposed on the first surface, a conductive through hole is disposed on the non-metal part; wherein the conductive through hole passes through the first surface and the second surface; wherein a first end of the conductive through hole located on the first surface is electrically connected to the antenna grain line located on the first surface, a second end of the conductive through hole located on the second surface is configured to electrically connect to a first signal line disposed in the electronic device, and wherein the first signal line is electrically connected to an antenna transceiver module.

8. The enclosure structure according to claim 1, wherein when the antenna grain line is disposed on the first surface, a second signal line is disposed on the second surface; wherein the second signal line extends to an edge of the second surface and is electrically connected to the antenna grain line located on the first surface; wherein the second signal line is configured to electrically connect to a first signal line disposed in the electronic device, and wherein the first signal line is electrically connected to an antenna transceiver module.

9. An enclosure structure of an electronic device, comprising:

an enclosure, comprising a non-metal part made of a non-metal material, wherein the non-metal part has a first surface and a second surface that are opposite to each other, wherein the first surface faces an exterior of an electronic device, wherein the second surface faces an interior of the electronic device, a first area is formed on the second surface, and a second area is an area other than the first area on the second surface;

an antenna grain line, wherein the antenna grain line is located in the first area and is connected; and an auxiliary grain line, wherein the auxiliary grain line is located in the second area and is disconnected, wherein the antenna grain line and the auxiliary grain line each comprise, in a direction away from the enclosure, a transition layer, a conductive layer, and a corrosion-resistant layer that are disposed in a stacked manner.

10. The enclosure structure according to claim 9, wherein the enclosure structure further comprises:
a protective layer that covers exteriors of the antenna grain line and the auxiliary grain line.

11. The enclosure structure according to claim 9, wherein line widths of the antenna grain line and the auxiliary grain line each range from 0.5 μm to 1000 μm, wherein a spacing between two adjacent branches of the antenna grain line ranges from 5 μm to 1000 μm, and wherein a spacing between two adjacent branches of the auxiliary grain line ranges from 5 μm to 1000 μm.

12. An electronic device, comprising:
an enclosure structure comprising:
an enclosure, a non-metal part made of a non-metal material, wherein the non-metal part has a first surface and a second surface that are opposite to each other, wherein the first surface faces an exterior of the electronic device, and wherein the second surface faces an interior of the electronic device; and
an antenna grain line disposed on the first surface; or
a groove disposed on the second surface, wherein the antenna grain line is disposed in the groove,
wherein the antenna grain line comprises, in a direction away from the enclosure, a transition layer, a conductive layer, and a corrosion-resistant layer that are disposed in a stacked manner; and
a circuit board, disposed inside the electronic device, wherein an antenna transceiver module and a first signal line connected to the antenna transceiver module are disposed on the circuit board, and wherein the first signal line is electrically connected to the antenna grain line.

13. The electronic device according to claim 12, wherein the antenna grain line is connected to the first signal line through a coupled feeding.

14. An enclosure structure preparation method, comprising:
disposing an antenna grain line on a first surface, wherein an enclosure structure comprises an enclosure, the enclosure comprises a non-metal part made of a non-metal material, wherein the non-metal part has a first surface and a second surface that are opposite to each other, wherein the first surface faces an exterior of an electronic device, and wherein the second surface faces an interior of the electronic device; or
disposing a groove on the second surface, and disposing the antenna grain line in the groove,
wherein the disposing the antenna grain line comprises:
disposing, in a direction away from the enclosure, a transition layer, a conductive layer, and a corrosion-resistant layer in a stacked manner, to form the antenna grain line.

15. The enclosure structure preparation method according to claim 14, further comprising:
after the antenna grain line is disposed, disposing a protective layer, wherein the protective layer covers an exterior of the antenna grain line.

16. The enclosure structure preparation method according to claim 14,
wherein, when the antenna grain line is disposed on the first surface, the disposing the antenna grain line comprises:
covering an antenna film layer on the first surface; and
forming the antenna grain line on the antenna film layer;
wherein, when the antenna grain line is disposed in the groove, the disposing the antenna grain line comprises:
covering the antenna film layer on a bottom surface of the groove; and
forming the antenna grain line on the antenna film layer.

17. The enclosure structure preparation method according to claim 16, wherein the forming the antenna grain line on the antenna film layer comprises:
performing etching or laser engraving on the antenna film layer to form the antenna grain line.

18. The enclosure structure preparation method according to claim 14,
wherein, when the antenna grain line is disposed on the first surface, the disposing the antenna grain line comprises:
performing transfer printing, screen printing, spray coating, or exposure development on the first surface, to form the antenna grain line;
wherein, when the antenna grain line is disposed in the groove, the disposing the antenna grain line comprises:
performing transfer printing, screen printing, spray coating, or exposure development on a bottom surface of the groove, to form the antenna grain line.

19. The enclosure structure preparation method according to claim 14,
wherein, when the antenna grain line is disposed on the first surface, the disposing the antenna grain line comprises:
dividing the first surface into a first area and a second area, wherein the second area is an area other than the first area on the first surface;
preparing the antenna grain line in the first area, wherein the antenna grain line is connected such that the antenna grain line includes a plurality of branches and the plurality of branches are connected to each other; and
preparing an auxiliary grain line in the second area, wherein the auxiliary grain line is disconnected such that the auxiliary grain line includes a plurality of branches and there is a breakpoint among the plurality of branches;
wherein, when the antenna grain line is located in the groove, the disposing the antenna grain line comprises:
dividing a bottom surface of the groove into a third area and a fourth area, wherein the fourth area is an area other than the third area on the bottom surface of the groove;
preparing the antenna grain line in the third area, wherein the antenna grain line is connected; and
preparing the auxiliary grain line in the fourth area, wherein the auxiliary grain line is disconnected.

20. A method for preparing an enclosure structure, comprising:
dividing a second surface into a first area and a second area, wherein the first area is an area other than the second area on the second surface, wherein the enclosure structure comprises an enclosure, wherein the enclosure comprises a non-metal part made of a non-metal material, wherein the non-metal part has a first surface and the second surface that are opposite to each other, wherein the first surface faces an exterior of an electronic device, and wherein the second surface faces an interior of the electronic device;
disposing an antenna grain line in the first area, wherein the antenna grain line is connected; and
disposing an auxiliary grain line in the second area, wherein the auxiliary grain line is disconnected, wherein disposing the antenna grain line and disposing the auxiliary grain line comprises:
  disposing, in a direction away from the enclosure, a transition layer, a conductive layer, and a corrosion-resistant layer in a stacked manner, to form the antenna grain line and the auxiliary grain line.

21. The method according to claim 20, further comprising:
  after the antenna grain line and the auxiliary grain line are disposed, disposing a protective layer, wherein the protective layer covers exteriors of the antenna grain line and the auxiliary grain line.

\* \* \* \* \*